US007501851B2

(12) United States Patent
Venditti et al.

(10) Patent No.: US 7,501,851 B2
(45) Date of Patent: Mar. 10, 2009

(54) CONFIGURABLE VOLTAGE MODE TRANSMITTED ARCHITECTURE WITH COMMON-MODE ADJUSTMENT AND NOVEL PRE-EMPHASIS

(75) Inventors: Michael Ben Venditti, Montreal (CA); William Michael Lye, Coquitlam (CA)

(73) Assignee: PMC Sierra Inc., Santa Clara, CA (US)

( * ) Notice: Subject to any disclaimer, the term of this patent is extended or adjusted under 35 U.S.C. 154(b) by 0 days.

(21) Appl. No.: 11/752,941

(22) Filed: May 24, 2007

(65) Prior Publication Data
US 2007/0285120 A1    Dec. 13, 2007

Related U.S. Application Data

(60) Provisional application No. 60/809,094, filed on May 26, 2006.

(51) Int. Cl.
*H03K 17/16* (2006.01)
*H03K 19/003* (2006.01)

(52) U.S. Cl. ............................. 326/30; 326/32; 326/86; 326/26

(58) Field of Classification Search ....................... None
See application file for complete search history.

(56) References Cited

U.S. PATENT DOCUMENTS

| | | | |
|---|---|---|---|
| 6,292,014 B1 * | 9/2001 | Hedberg ....................... 326/30 |
| 6,448,813 B2 | 9/2002 | Garlepp |
| 6,531,892 B2 * | 3/2003 | Ghia et al. .................... 326/50 |
| 6,680,681 B1 | 1/2004 | Hsu et al. |
| 6,696,852 B1 | 2/2004 | Brunolli |
| 6,771,097 B1 | 8/2004 | Po Ho et al. |
| 6,812,733 B1 | 11/2004 | Plasterer et al. |
| 7,030,657 B2 | 4/2006 | Stojanovic et al. |
| 7,109,744 B1 * | 9/2006 | Shumarayev et al. ......... 326/30 |
| 7,190,931 B2 | 3/2007 | Casper et al. |
| 2006/0267812 A1 | 11/2006 | Bunin |
| 2007/0024327 A1 | 2/2007 | Howe et al. |

OTHER PUBLICATIONS

Signaling Techniques for NoC Ethiopia Nigussie, Johanna Tuominen, Jouni Isoaho Turku Centre for Computer Science TUCS Technical Reports. No. 612, May 2004 pp. 1-31.
A 27-m W 3.6 Gb/s I/O Transceiver Koon-Lun , Jackie Wong, Hamid Hatamkhani,Mozhgan mansuri, Member IEEE,and Chich-King Ken Yang,Member ,IEEE From the IEEE Journal of Solid-State Circuits vol. 39 No. 4 Apr. 2004.

\* cited by examiner

*Primary Examiner*—Anh Q Tran
(74) *Attorney, Agent, or Firm*—Mark M. Friedman

(57) ABSTRACT

Configurable voltage mode transmitter architectures are based on combinations of drive cells and parallel termination cells connected in parallel across an external load to provide configurable output characteristics. Each drive cell and parallel termination can be individually enabled, various configurations of enabled cells providing the output characteristics configurability. In some embodiments, dedicated or configured pre-emphasis drive cells with individual enablement capability are added. In some embodiments, pull-down and pull-up cells with individual enablement capability are added to provide additional configurability options. When present, the pre-emphasis, pull-down and pull-up cells are connected in parallel across the external load to provide pre-emphasis features to the output.

35 Claims, 16 Drawing Sheets

PRIOR ART

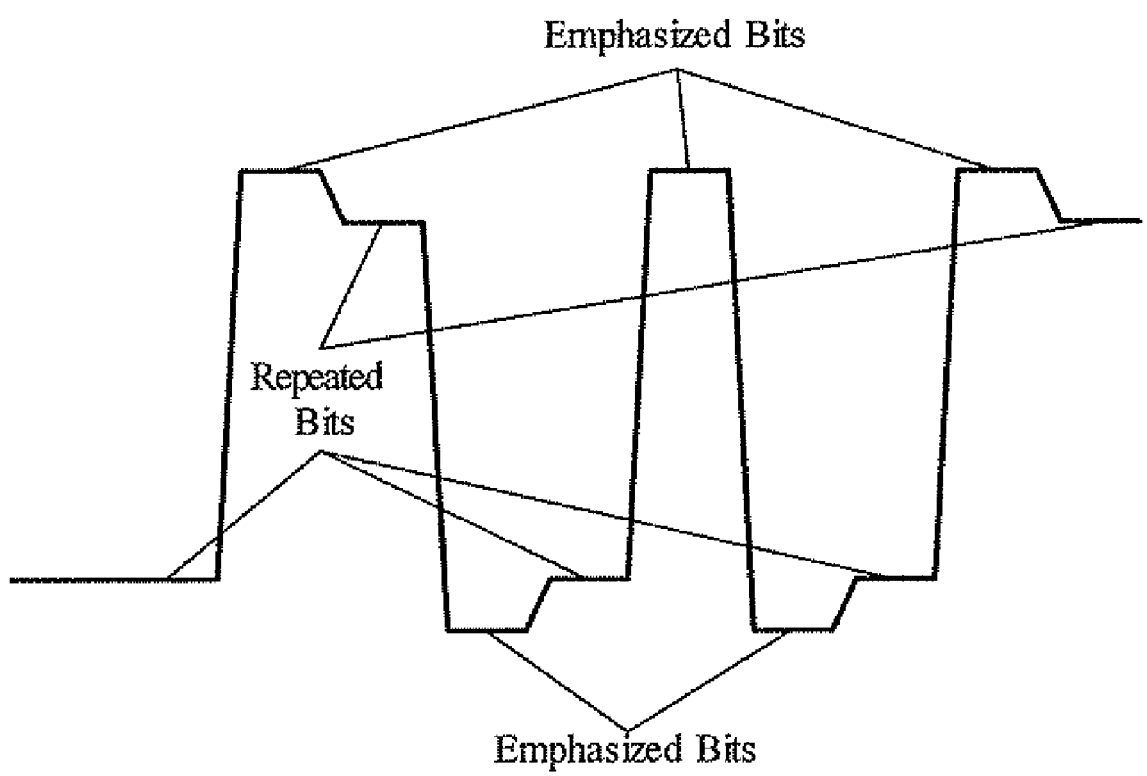

PRIOR ART

CONFIGURABLE VOLTAGE MODE TRANSMITTED ARCHITECTURE WITH COMMON-MODE ADJUSTMENT AND NOVEL PRE-EMPHASIS

CROSS REFERENCE TO RELATED APPLICATIONS

The present invention claims priority from U.S. Provisional Patent Application No. 60/809,904 filed 26 May 2006, which is incorporated herein by reference in its entirety.

FIELD OF THE INVENTION

The present invention relates in general to transmitters used to drive signals off-chip and in particular to voltage mode transmitters.

BACKGROUND OF THE INVENTION

Transmitter Architectures

A transmitter is an output driver of an integrated circuit for the general purpose of transmitting signals originating from one device to other devices in an electronic system. In modern electronic systems, data transmission typically occurs at high data rates (>100 Mbps) over transmission-line type signal lines with transmitter and receiver end-terminations.

For long signal lines, it is common to employ differential signal encoding to mitigate the effects of signal degradation (e.g. noise), in addition to pre-emphasis techniques, the latter providing means for mitigating the effects of inter-symbol-interference caused by the transmission of data over a band-limited channel.

To generalize the utility of a transmitter circuit, the transmitter is often implemented with adjustable characteristics such as output amplitude, source terminations, and degree of pre-emphasis. In modern transmitter applications, data transmission efficiency is often achieved as part of a serialization/de-serialization (SERDES) link, in which parallel source data is serialized at a scaled data rate for transmission by a transmitter circuit over serial links, and subsequently received at a receiver circuit and de-serialized to recover the original parallel data.

Conventional Transmitter Architectures

Class A Transmitters

A class A transmitter structure typically consists of a single differential transistor pair with a tail current source and load resistors R driving a differential output voltage signal. TXOP-TXON, see FIG. 1A. INP and INN are respectively the positive and negative input portions of a differential input voltage signal INP-INN. Similarly, TXOP and TXON are the respective positive and negative transmit (TX) output portions of differential output voltage signal TXOP-TXON. Such a configuration is often referred to as a current-mode logic (CML) structure. "I" refers to the tail current source magnitude. The differential output voltage signal is shown being received by a floating termination load resistor $R_L$, but could equivalently be a grounded and/or center-tapped termination.

Class AB Transmitters

A class AB transmitter structure typically consists of a parallel combination of pull-up and pull-down class A structures, with the differential transistor pair of each class A structure serving as the load resistors for the other class A structure, see FIG. 1B. A class AB structure is used for example in low voltage differential signaling (LVDS) applications. The differential output voltage signal TXOP-TXON is shown being received by a floating termination load resistor $R_L$, but could equivalently be a grounded and/or center-tapped termination. In certain applications (not shown in FIG. 1B), the transmitter structure also includes an internal termination between TXOP and TXON.

Although not explicitly shown in FIG. 1B, a common-mode feedback (CMFB) is typically required via resistors $R_{CMFB}$ (large) and voltage signal $V_{CMFB}$ to achieve uniform head and tail current source magnitudes and a desired common-mode output level.

Voltage-Mode Transmitters

The class A and AB structures presented above have a basic commonality, in that the unit currents are directionally steered to generate a source current that ultimately produces a net voltage swing across a load resistance as an IR voltage drop. In this sense, they are inherently current-mode structures. A voltage-mode (VM) transmitter structure differs from these structures fundamentally in that, rather than generating a source current, it generates a source voltage, which subsequently produces a net voltage swing across a load resistance as a voltage division. Current state of the art for voltage mode transmitter architectures and related design methodologies are represented by the following public domain publications, which are incorporated herein by reference in their entirety: U.S. Pat. No. 6,448,813 to Garlepp, U.S. Pat. No. 6,812,733 to Plasterer U.S. Pat. No. 6,771,097 to Seng and Ho and U.S. Pat. No. 6,696,852 to Brunolli and Zhang, L.; Wilson, J.; Bashirullah, R.; Lei Luo; Jian Xu; Franzon, P, "Driver pre-emphasis techniques for on-chip global buses," in Proc. 2005 Int. Symp. Low Power Electronics and Design, pp. 186-191.

An exemplary VM transmitter structure is illustrated in FIG. 2A. When the input is logically HIGH (INP HIGH and INN LOW), resistive paths are created between TXOP and VDD and between TXON and VSS. Similarly, when the input is logically LOW (INP LOW and INN HIGH), resistive paths are created between TXOP and VSS and between TXON and VDD. Any of the enabled resistive paths composed of R* and the effective drain-source resistance of the enabled transistor are generally balanced through transistor sizing, and may be denoted simply as "R". That is, R is the sum of the physical resistor and the effective drain-source resistance of a MOS transistor. In practice, one would target an overall desired R, determine how it should be split up between fixed resistance (R*) and drain-source MOS resistance. Once that is determined, the MOS device simply needs to be sized properly to achieve the desired overall R. A preliminary MOS size can be worked out by hand and then tweaked in simulation. Together with an internal parallel termination resistor $R_T$ between TXOP and TXON, an unloaded voltage swing is determined as a voltage division of VDD-VSS by $R_T$ and 2 R. The loaded voltage swing is determined by another voltage division between the external load resistor $R_L$ and the output resistance of the transmitter.

An alternative but functionally equivalent version of the VM structure is illustrated in FIG. 2B, where the transistor pull-up and pull-down paths are encapsulated inside CMOS-like inverters and where only half as many R* resistors are needed. Again, the differential output voltage signal is shown being received by a floating termination load resistor $R_L$, but could equivalently be a grounded and/or center-tapped termination, Further, it should be noted that the pull-up/pull-down structures presented in FIGS. 2A and 2B are analogous to the class AB current mode transmitter structure. VM structures analogous to class A current-mode structures may also be implemented.

Output Characteristics

The differential and common-mode output characteristics of the various transmitter structures presented thus far are summarized in Table 1. The || notation is meant to convey "in parallel with", as in conventional electronics nomenclature. $R_{Odiff}$ is the differential output resistance, $V_{Odiff}$ is the differential (loaded) output swing, $R_{CM}$ is the common-mode output impedance, and $V_{CM}$ is the common-mode output voltage.

TABLE 1

| | | Transmitter Structure | |
|---|---|---|---|
| Parameter | Class A[1] | Class AB[2,3] | VM |
| $R_{Odiff}$ | $2(R\|r_o) \approx 2R$ | $2(R_{CMFB}\|r_o)$ (large) | $R_T\|2R$ |
| | | $2\left(\frac{R_T}{2}\|R_{CMFB}\|r_o\right) \approx R_T$ | |
| $V_{Odiff}$ | $I \cdot (R_{Odiff}\|R_L)$ | $2 \cdot I \cdot (R_{Odiff}\|R_L)$ | $2 \cdot VDD \cdot \frac{R_T}{R_T + 2R} \cdot \frac{R_L}{R_L + R_{Odiff}}$ |
| $R_{CM}$ | $\frac{1}{2}(R\|r_o)$ | $\frac{r_o}{4}$ (large) | $\frac{R}{2}$ |
| $V_{CM}$ | $VDD - R \cdot \frac{I}{2}$ | set by CMFB | $\frac{VDD}{2}$ |

Notes:
[1]For class A structures, $r_o$ represents the output resistance of the NMOS transistors
[2]For class AB structures, $r_o$ represents the output resistance of either the PMOS or NMOS transistors. For simplicity, it is assumed that both device types have the same output resistance.
[3]For class AB structures, the differential output impedance has two possible expressions. The first expression refers to the case of a transmitter without internal termination, and the second expression refers to the case for a transmitter with internal termination $R_T$.

For class AB structures, the large differential output impedance yields an approximate expression of $2 \cdot I \cdot R_L$ (or $I \cdot R_L$, for the case of an internally terminated transmitter with $R_T = R_L$) for the differential output swing. Further, in typical applications involving class A and VM structures, the differential output impedance of the transmitter is set to match the resistance of the termination—i.e. $R_{Odiff} = R_L$. For class A and VM structures, this yields $$I \cdot \frac{R_L}{2} \text{ and } VDD \cdot \frac{R_T}{R_T + 2R},$$

respectively, for the differential voltage swing. It is further noted that, for the VM structure, the total resistance between VDD and VSS is $2R + R_T\|R_L$. Thus, one can write equivalent expressions for the supply current draw of each transmitter structure as a function of differential output voltage swing, as summarized in Table 2.

TABLE 2

| | Transmitter Structure | |
|---|---|---|
| Class A | Class AB[1] | VM |
| $I = \frac{2 \cdot V_{Odiff}}{R_L}$ | $I \approx \frac{V_{Odiff}}{2 \cdot R_L}$ | $I = \frac{V_{Odiff}}{2 \cdot R_T\|R_L}$ |

TABLE 2-continued

| | Transmitter Structure | |
|---|---|---|
| Class A | Class AB[1] | VM |
| | $I \approx \frac{V_{Odiff}}{R_L}$ | |

For class AB structures, the supply current draw has two possible expressions. The first expression refers to the case of a transmitter without internal termination, and the second expression refers to the case for a transmitter with internal termination $R_T = R_L$. As can be seen in Table 2, the class A transmitter structure consumes by far the most power for a given differential output swing, whereas the VM structure consumes the least.

Challenges/Issues with Conventional Architectures

Class A and AB Transmitters

Headroom

For large output swing and/or low supply voltages, the settled headroom on the tail current sources in class A and AB transmitters is reduced, lowering its output impedance due to channel length modulation and providing less current to the output load than intended. It is common, for example in 0.13 μm designs with a 1.2V nominal supply voltage, to not be able to scale linearly the output swing beyond a certain point with a similar scaling of the nominal tail current source magnitude.

To get around this problem in class A designs, pull-up inductors on the transmitter outputs to VDD have been employed to bring up the common mode output level close to VDD, thus relieving headroom issues on the current source. The disadvantages of this approach are that on-chip inductors can be prohibitively large, and external inductors add to the bill of materials and can make board layout significantly more complicated. An alternative solution is to employ a higherthan-standard VDD supply on the output stage of the transmitter. One disadvantage of this approach is that reliability concerns are now present at the interface of the output stage and on the transistors in the output stage itself. Additionally, the need for an extra supply voltage can complicate on-chip power plane distribution and power net routing in the package. For class AB transmitters, this can complicate the interface with pre-driver circuitry.

Return Loss

For class A designs, as the output swing increases, the differential output impedance of the transmitter decreases with the degradation of the output resistance characteristics of the output stage differential pair. This in turn degrades the return loss of the transmitter. A class AB transmitter without internal termination has high output impedance and thus suffers from poor intrinsic return loss.

Common-Mode Level

For class A designs, the output common-mode level is typically referenced to a supply (VDD for a conventional NMOS-based design; VSS for a PMOS-based design) and varies (decreasing in the case of a conventional NMOS-based design) with increasing output swing. This can be problematic for applications in which there is a specification on the output common-mode level. A conventional class AB transmitter requires feedback control to establish the common-mode level. In some applications, a parallel combination of a class AB transmitter (without internal termination) with a VM transmitter has been used in place of common-mode feedback, see for example U.S. Pat. No. 6,812,733 to Plasterer et al. When this is done, it also addresses the problem of poor intrinsic return loss.

Interface with CMOS Pre-Drivers

In many transmitter designs, it is necessary to perform a number of processing and buffering operations (e.g. data serialization, data path multiplexing) in circuit stages prior to the transmitter output stage. The interface between these processing stages and the output stage is normally comprised of pre-driver buffer circuitry. If a conventional (NMOS-based design) class A or an AB transmitter output stage is directly interfaced to a pre-driver stage implemented as CMOS inverters, there is an inherent waste of a portion of the CMOS pre-driver output swing as the gates of the differential pair devices are driven below the gate-source voltage required to turn them off. Further, the ideal crossing level of the signal at the output of the CMOS pre-driver (from the perspective of the class A/AB output driver) will vary with output swing setting. Deviations from the ideal crossing level will result in unwanted duty-cycle distortion at the transmitter output.

VM Transmitters

The output characteristics of the conventional Voltage-Mode/Thevenin transmitter are dependent on resistors $R_T$ and R and are thus not adjustable. The interdependence of differential output impedance and output swing may make it difficult to meet potentially incompatible specifications for these parameters.

Common-Mode Adjustment

Some specifications require that the common-mode level be adjustable in a DC coupled environment. With the possible exception of the class AB transmitter, none of the conventional drivers presented in this section have a programmatic means to accomplish this. The class AB transmitter can potentially implement common-mode adjustment in the same manner (i.e. feedback) as it normally would.

Conventional Pre-Emphasis Implementations

For long signal lines, it is common to employ pre-emphasis techniques to mitigate the effects of inter-symbol-interference caused by the transmission of data over a band-limited channel. There are many different forms of pre-emphasis in transmitter implementations, see e.g. U.S. Pat. No. 6,680,681 and the references cited therein. Selected bits can either be emphasized or de-emphasized, and multiple emphasis methodologies can be employed simultaneously. The most common form is post-cursor pre-emphasis, in which "emphasized bits" immediately following a transition between output logic states have a larger magnitude than repeated bits at the same logic level. This form of pre-emphasis is illustrated in FIG. 3. In any of the conventional transmitter architectures, a typical implementation of pre-emphasis is achieved by splitting the output stage driver into separate drivers for regular drive and pre-emphasis drive (with shared termination resistors in the case of a class A transmitter). The regular drive portion of the output stage is operated with the normal input data, and the pre-emphasis portion is operated with a modified version of the input data (one-bit delayed and inverted in the case of post-cursor pre-emphasis).

Class A/AB Transmitter

A conventional pre-emphasis implementation involving a class A transmitter architecture is illustrated in FIG. 4. The arrangement would be completely analogous for class AB transmitters. The normal and pre-emphasis data inputs are SDP/SDN (serial data) and PSDP/PSDN (pre-emphasis serial data), respectively. In all figures herein, SDP and SDN refer respectively to the positive and negative portions of the serial data stream, which is the data intended to be transmitted. Similarly, PSDP and PSDN refer respectively the positive and negative portions of the pre-emphasis serial data stream. Generally, $I_{REG} > I_{PRE}$ and $I = I_{REG} + I_{PRE}$. For the case of post-cursor pre-emphasis, when driving an emphasized bit, the two portions of the output stage driver operate constructively, providing a total current $I_{REG} + I_{PRE}$ to produce the output swing. Similarly, when driving a non-emphasized bit, the two portions of the output stage driver operate destructively, providing a net current $I_{REG} - I_{PRE}$ to produce the output swing. In either case, the total current drawn from VDD remains $I_{REG} + I_{PRE}$. Under these circumstances, the pre-emphasis ratio (PER—the ratio of non-emphasized to emphasized bit amplitude) can be derived from Table 1 by substituting for I:

$$PER = \frac{I_{REG} - I_{PRE}}{I_{REG} + I_{PRE}} \quad (1)$$

VM Transmitter

A conventional pre-emphasis implementation involving a VM transmitter architecture is illustrated in FIG. 5. For post-cursor pre-emphasis, PSDP/PSDN is a one-bit delayed and inverted version of SDP/SDN. $R_{REG}^*$ and $R_{PRE}^*$ are analogous to R* from various other figures—i.e. they are physical resistors. The subscript suffixes merely differentiate between the regular and pre-emphasis paths of the transmitter. The two portions of the output stage driver are differentiated by the magnitude of the resistive path established between the transmitter outputs and the supply. In the case of the regular drive portion, resistive paths of $R_{REG}$ are established ($R_{REG}^*$+the transistor drain-source resistance). For the pre-emphasis drive portion, resistive paths of $R_{PRE}$ are established. Generally, $R_{PRE} > R_{REG}$ and, R is the parallel combination of $R_{REG}$ and $R_{PRE}$. For the case of post-cursor pre-emphasis, when driving an emphasized bit, the two portions of the output stage driver operate constructively to establish the output swing. Similarly, when driving a non-emphasized bit, the two portions of the output stage driver operate destructively to establish the output swing.

FIG. 6A shows the equivalent resistive paths for the VM transmitter configured to drive an emphasized bit with SDP and PSDP both HIGH. Output characteristics in this configuration are readily obtained from Table 1. FIG. 6B shows equivalent resistive paths for the VM transmitter configured to drive a non-emphasized bit with SDP HIGH and PSDP LOW. In FIG. 6, $R_{REG}$ and $R_{PRE}$ are analogous to the composite R discussed in the section on Voltage Mode transmitters earlier in this disclosure. It comprises the physical resistor $R_{REG}*$ or $R_{PRE}*$, plus the effective drain-source resistance of the enabled MOS device (which depends on what the data is, of course) in the inverters depicted in FIG. 5.

The output characteristics of a VM transmitter driving a non-emphasized bit are given in Equation 2.

$$R_{O_{diff}} = R_T \| 2(R_{REG} \| R_{PRE}) \quad (2)$$

$$V_{O_{diff}} = 2 \cdot VDD \cdot \left( \frac{1}{R_{REG}} - \frac{1}{R_{PRE}} \right) \cdot \frac{R_{O_{diff}}}{2} \cdot \frac{R_L}{R_L + R_{O_{diff}}}$$

The PER for a VM transmitter then becomes:

$$PER = \frac{R_{PRE} - R_{REG}}{R_{PRE} + R_{REG}} \quad (3)$$

Supply Current Draw

One consequence of implementing conventional pre-emphasis for a VM transmitter is that the current draw from VDD is dependent on whether the bit being transmitted is emphasized or not. This can be detailed in terms of the equivalent resistance between VDD and VSS depending on whether the current bit is emphasized or non-emphasized. Equation 4 gives the VDD/VSS resistance for a VM transmitter with pre-emphasis $$R_E = 2(R_{REG} \| R_{PRE}) + R_T \| R_L \text{ (emphasized)} \quad (4)$$

$$R_{NE} = \frac{2(R_{REG} \| R_{PRE}) + R_T \| R_L}{\left[ 1 + \frac{2(R_T \| R_L)}{R_{REG} + R_{PRE}} \right]}$$

$$= \frac{R_E}{\left[ 1 + \frac{2(R_T \| R_L)}{R_{REG} + R_{PRE}} \right]} \text{ (non-emphasized)}$$

$$\frac{R_E}{R_{NE}} = 1 + \frac{2(R_T \| R_L)}{R_{REG} + R_{PRE}}$$

$$= 1 + \frac{2(R_T \| R_L)(1 - PER)}{2R_{REG}}$$

Equation shows that more power is dissipated when driving a non-emphasized bit ($R_{NE}$ is always smaller than $R_E$) and that the fraction by which this power exceeds that of driving an emphasized bit increases with decreasing PER (i.e. with more pre-emphasis). A pattern-dependent supply current draw (beyond any current spikes occurring during transitions) is generally an undesirable feature of a transmitter.

In summary, prior art voltage mode transmitter structures have been implemented with a fixed configuration, resulting in fixed characteristics for a given load such as a fixed differential output voltage swing, fixed differential and common-mode output impedance and fixed common-mode output level. Further, the implementation of pre-emphasis for voltage-mode structures in an analogous manner to current-mode transmitter structures results in undesirable characteristics such as data-dependent power dissipation. Consequently, there is a need for, and it would be advantageous to have a voltage mode transmitter structure that addresses these limitations.

SUMMARY OF THE INVENTION

The present invention discloses voltage mode transmitter architectures or "structure" that address the limitations mentioned above, presenting a cell approach to the construction of a transmitter structure with configurability of its output swing characteristics. The invention discloses a basic structure and various extensions of this structure that allow control of the output common-mode characteristics and a more efficient pre-emphasis implementation.

According to the present invention there is provided a voltage mode transmitter including a drive cell having an enable/disable function, a drive cell input port and a drive cell output port and a parallel termination cell having an enable/disable function and a parallel termination cell output port, wherein the drive cell is connected with its input port to a differential serial data signal input and wherein the drive cell and the parallel termination cell are connected with their output ports in parallel across an external load to provide a configurable output parameter; whereby the drive cell and the parallel termination cell is enabled and disabled by a corresponding assertion of its respective enable/disable function and whereby the output parameter is configurable by enabling the drive cell or the parallel termination cell.

In some embodiments of the voltage mode transmitter, the voltage mode transmitter further includes a pre-emphasis structure coupled to the external load and used to provide a pre-emphasis functionality.

In some embodiments of the voltage mode transmitter, the output parameter is selected from the group consisting of a differential output impedance, a common-mode output voltage, an amount of pre-emphasis and a differential output voltage swing.

According to the present invention there is provided a voltage mode transmitter including a first plurality of N drive cells, each cell having an enable/disable function, a drive cell input port and a drive cell output port and a second plurality M of parallel termination cells, each cell having an enable/disable function and a parallel termination cell output port, wherein each drive cell is connected with its input port to a differential serial data signal input and wherein each drive cell and each parallel termination cell is connected with its output port in parallel across an external load to provide a configurable output parameter; whereby each drive cell and the parallel termination cell may be enabled and disabled by a corresponding assertion of their respective enable/disable function and whereby the output parameter is configurable by enabling at least one drive cell or parallel termination cell.

In some embodiments of the voltage mode transmitter, the voltage mode transmitter further includes a pre-emphasis structure coupled to the external load and used to provide a pre-emphasis functionality.

In some embodiments of the voltage mode transmitter having a pre-emphasis structure, the pre-emphasis structure is obtained by dividing the N drive cells into a bank of N-P regular drive cells and a bank of P pre-emphasis drive cells, wherein each pre-emphasis drive cell is connected with a respective input port to a differential pre-emphasis serial data input and whereby the pre-emphasis functionality is provided by enabling at least one pre-emphasis drive cell.

In some embodiments of the voltage mode transmitter having a pre-emphasis structure, the N-P regular drive cells include a number $DREG \geq 1$ of enabled regular drive cells, the P pre-emphasis drive cells include a number $DPRE \geq 0$ of enabled pre-emphasis drive cells, the transmitter includes an integer number $PT \geq 0$ of enabled parallel termination cells and DREG+DPRE+PT is a constant number chosen to provide a transmitter differential output impedance that matches the external load; whereby the configurability is obtained by varying at least one of DREG, DPRE and PT.

In some embodiments of the voltage mode transmitter having a pre-emphasis structure, the external load is predetermined, the parallel termination cell is disabled, the N-P regular drive cells include a number $DREG \geq 1$ of enabled regular drive cells chosen to provide a differential output impedance smaller than the predetermined external load.

In some embodiments of the voltage mode transmitter, the voltage mode transmitter further includes at least one pre-emphasis cell having an enable/disable function, a pre-emphasis cell input port and a pre-emphasis cell output port, wherein each pre-emphasis cell is connected with its input port to both the differential serial data signal input and to a differential pre-emphasis serial data input and connected with its output port in parallel across the external load.

In some embodiments of the voltage mode transmitter, the voltage mode transmitter further includes a pull-up cell having an enable/disable function and a pull-up cell output port, the output port connected to the external load and a pull-down cell having an enable/disable function and a pull-down cell output port, the output port connected to the external load, whereby the output voltage swing is also configurable by enabling at least one pull-up or pull-down cell.

According to the present invention there is provided a voltage mode transmitter comprising a first plurality N of drive cells, each drive cell having an enable/disable function for enabling or disabling the cell, a drive cell input port and a drive cell output port and a second plurality M of parallel termination cells, each parallel termination cell having a parallel termination cell output port and an enable/disable function for enabling or disabling the cell, wherein each drive cell is connected with its input port to a differential serial data signal input and wherein the drive cells and the parallel termination cells are connected in parallel across an external load to provide a configurable output parameter, wherein at least one drive cell is always enabled and wherein at least one drive cell other than the enabled drive cell and at least one parallel termination cell are combined into a combination cell that can be configured for operation as a cell selected from the group consisting of a drive cell, a parallel termination cell and a disabled cell; whereby the output parameter is configurable by enabling at least one cell selected from the group consisting of a drive cell, a parallel termination cell and a combination cell.

BRIEF DESCRIPTION OF THE DRAWINGS

The invention is herein described, by way of example only, with reference to the accompanying drawings, wherein.

FIG. 3 shows an illustration of post-cursor pre-emphasis.

DETAILED DESCRIPTION OF THE INVENTION

Configurable Voltage Mode Transmitter Architecture

Basic Architecture

The present invention discloses fully configurable versions of VM transmitter architectures. As used herein, "configurable" refers to a parameter selected from the group consisting of a differential output impedance (or resistance), a common-mode output voltage, an amount of pre-emphasis and a differential output voltage swing that can assume two or more different values. When not defined otherwise, all symbols used (e.g. VDD, VSS, SDP, SDN, NMOS, PMOS, etc) refer terms as commonly used in the art of electronic and electrical circuits and in particular in the art of voltage mode transmitters and drivers. The VM transmitter architectures of the present invention are illustrated in detail in the form of electrical/electronic circuits in FIGS. 7-10. The circuit and technological implementation (e.g. in the form of an integrated circuit) of such architectures should be clear to anyone skilled in the art based on these figures. The detailed description below provides both additional enablement and details on modes of operation.

Figure 1A:
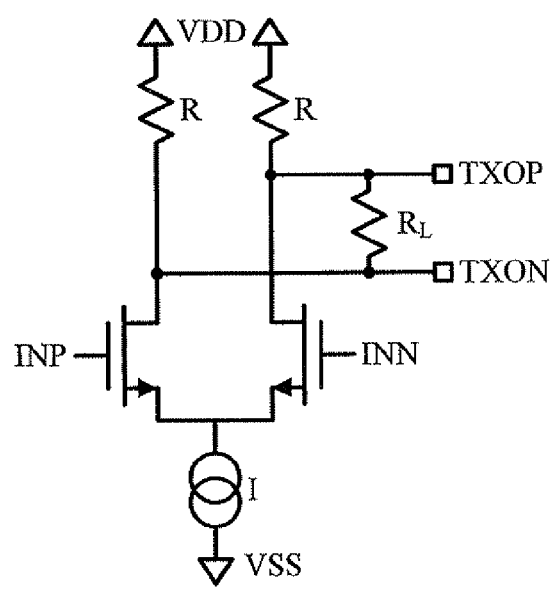
FIG. 1A shows an illustrative class A transmitter structure.
Figure 1B:
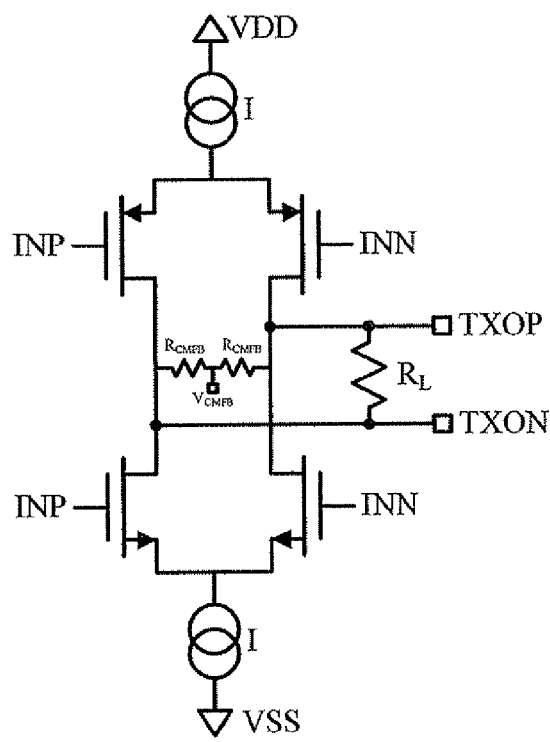
FIG. 1B shows an illustrative class AB transmitter structure.
Figure 2A:
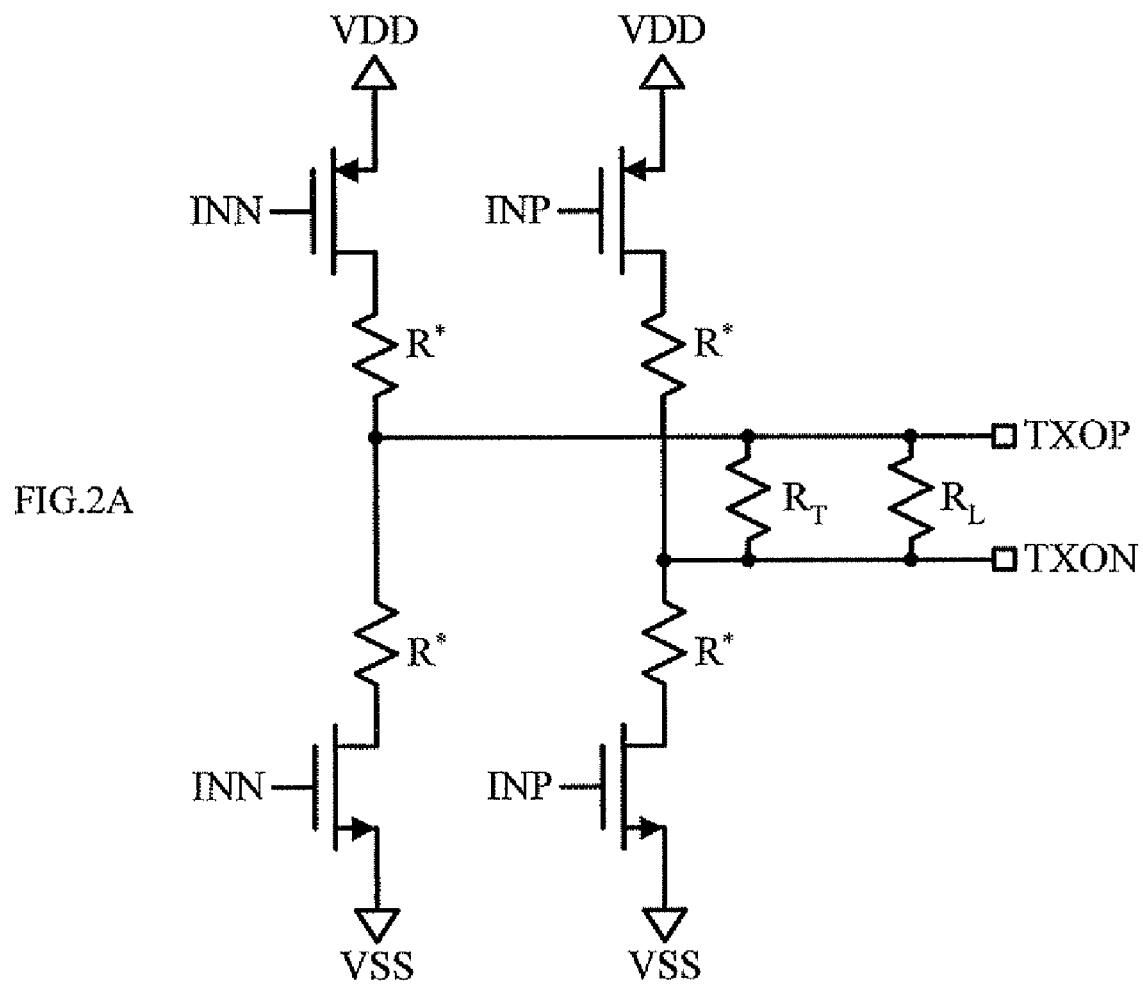
FIG. 2A shows an illustrative VM transmitter Structure.
Figure 2B:
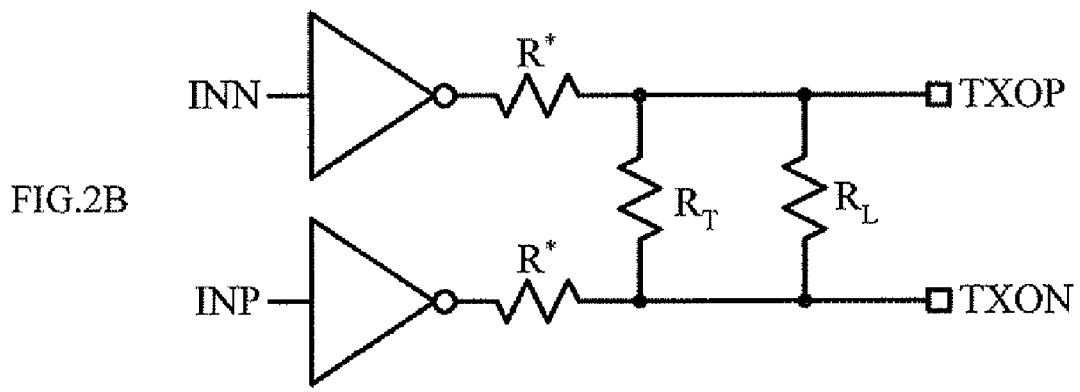
FIG. 2B shows another illustrative VM transmitter structure.
Figure 4:
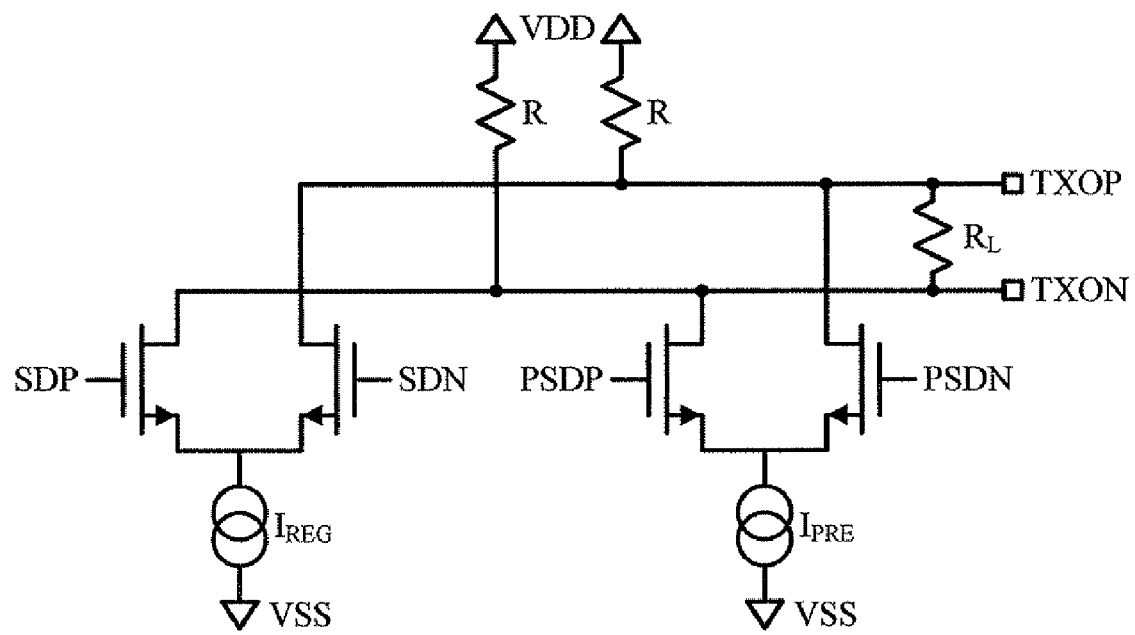
FIG. 4 shows an illustration of pre-emphasis implementation with a class A transmitter.
Figure 5:
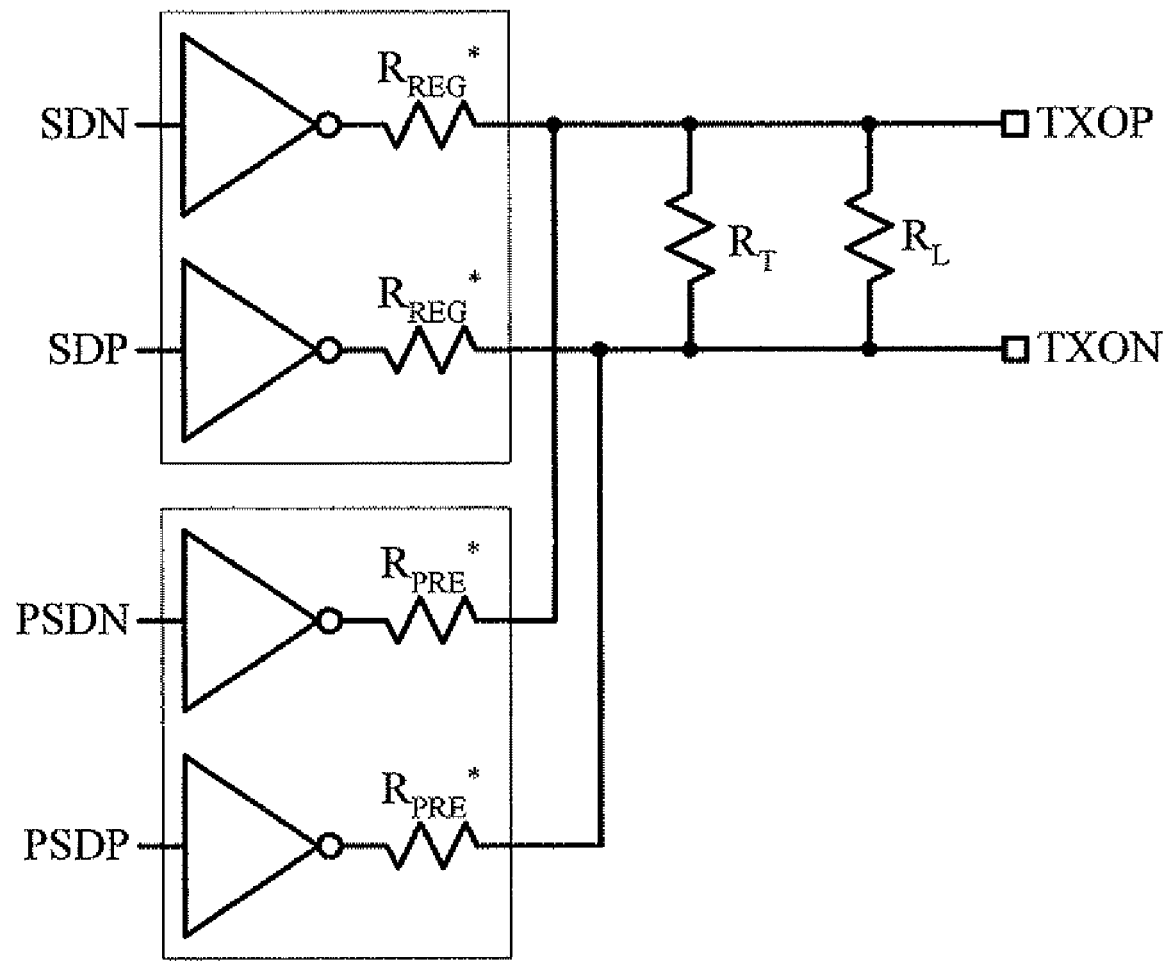
FIG. 5 shows an illustration of pre-emphasis implementation with a VM transmitter.
Figure 6A:
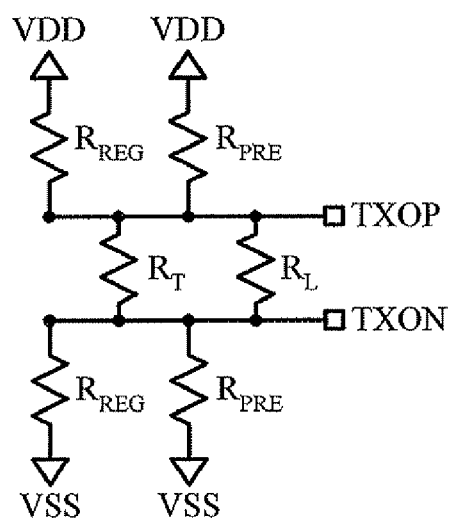
FIG. 6A shows a VM transmitter driving an emphasized bit.
Figure 6B:
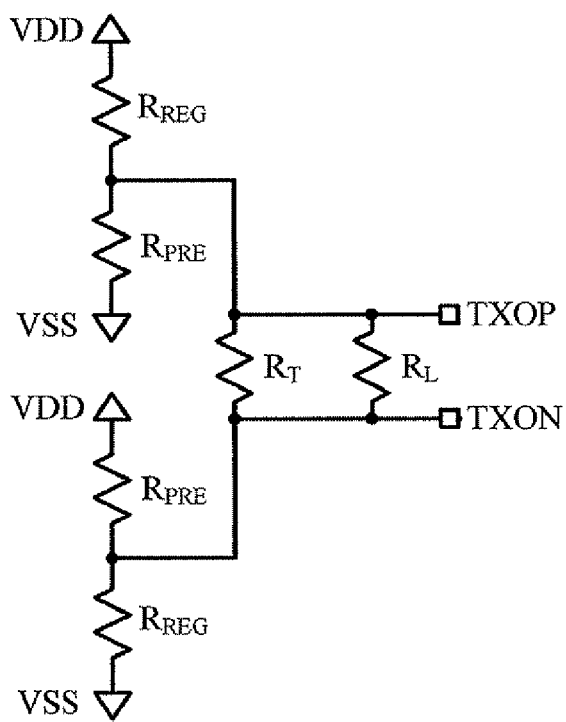
FIG. 6B shows a VM transmitter driving a non-emphasized bit.
Figure 7A:
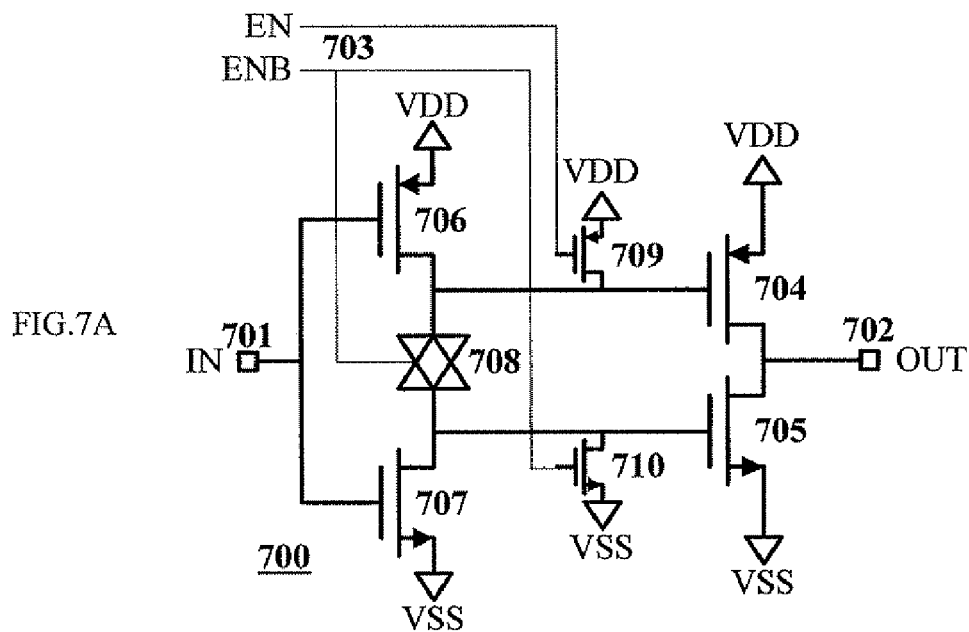
FIG. 7A shows a drive cell element of the present invention.
Figure 7B:
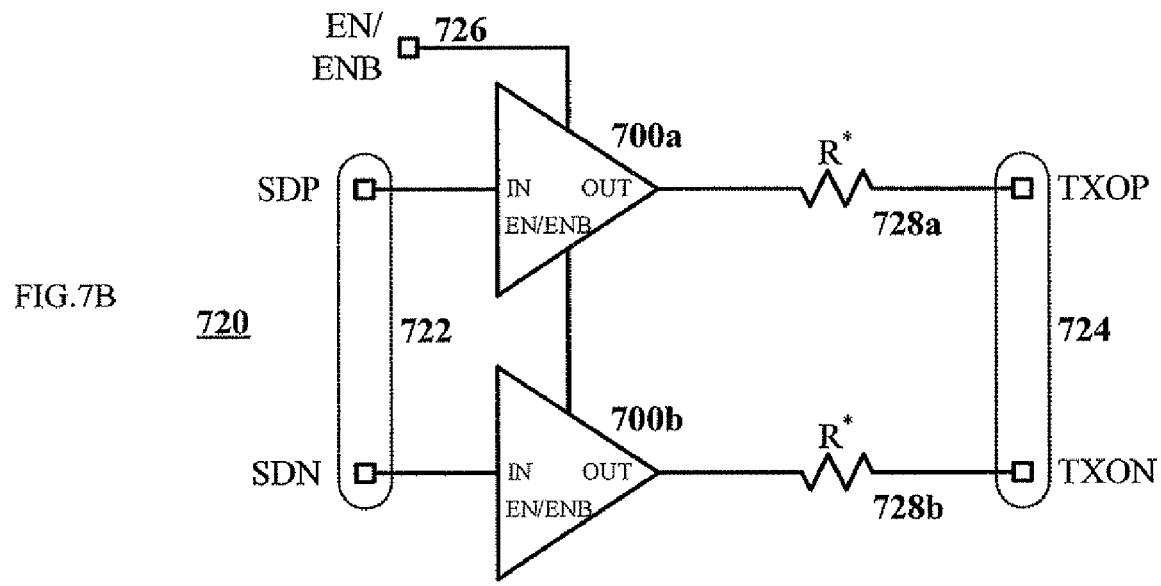
FIG. 7B shows a drive cell of the present invention.
Figure 7C:
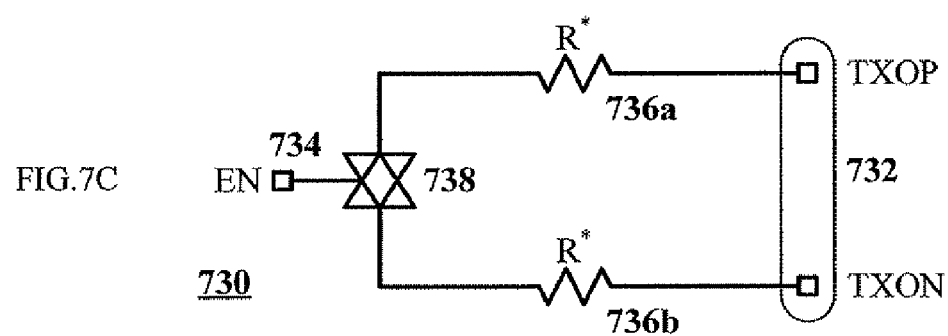
FIG. 7C shows a parallel termination cell of the present invention.

In a first embodiment, a configurable VM transmitter can be constructed from combinations of two basic "unit cells" (also referred to simply as "cells"), a drive unit cell 720 shown in FIG. 7B and a parallel termination unit cell 730 shown in FIG. 7C. An exemplary drive cell 720 includes two drive cell elements 700a,b (each shown in FIG. 7A as a cell element 700), each drive cell element operative to receive a common enable/disable control signal EN/ENB 726, and two resistors R* 728a,b, interconnected with an output port 724 as shown in FIG. 7B. An exemplary parallel termination cell 730 (FIG. 7C) includes two resistors 736a,b and a transmission gate 738 interconnected with an output port 732 as well as an enable/disable control port (EN) 734 connected to transmission gate 738. The enable/disable control port and the transmission gate form an "enable/disable function".

Each drive cell element 700 implements a tri-state buffer with an input port (IN) 701, an output port (OUT) 702, an enable/disable control port (EN/ENB) 703, a first inverter-like structure that includes a PMOS transistor 706, a NMOS transistor 707 and a transmission gate 708 and a second inverter-like structure comprised of a PMOS transistor 704, a NMOS transistor 705, a pull-up PMOS transistor 709 and a pull-down NMOS transistor 710, interconnected as shown in FIG. 7A.

Figure 7D:
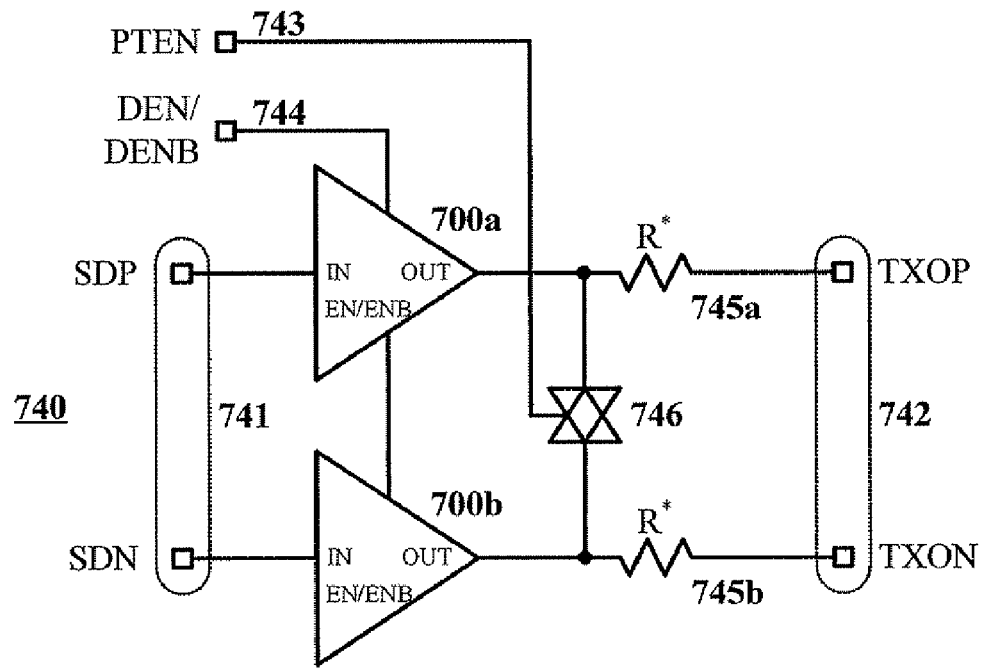
FIG. 7D shows a single, multi-purpose drive/parallel termination combination cell of the present invention.

Each drive cell is connected with an input port 722 to the SDP and SDN inputs (FIG. 7D). Each drive cell and each parallel termination cell is connected with its respective output port 724, 732 across an external load $R_L$ (shown in FIG. 7E) to provide a differential output voltage swing across a transmitter output TXOP-TXON. The drive and parallel termination cells introduce configurability into the VM transmitter by virtue of the fact that they can be enabled or disabled.

When drive cell element 700 is enabled by asserting EN/ENB (EN HIGH, ENB LOW), transmission gate 708 is enabled, thus enabling the first inverter-like structure to operate as an inverter. Further, pull-up 709 and pull-down 710 transistors are disabled, causing the second inverter-like structure to operate as an inverter. The combination of the two inverter-like structures enables the buffer function.

When the drive cell element is disabled by not asserting EN/END (EN LOW, ENB HIGH), transmission gate 708 is disabled, effectively disabling the first inverter-like structure. Further, pull-up 709 and pull-down 710 transistors are enabled, disabling PMOS 704 and NMOS 705 transistors, effectively disabling the second inverter-like structure. This results in input port 701 being fully disconnected from output port 702, disabling the drive cell element.

A drive cell is enabled by asserting the EN (set HIGH) and END (set LOW) control signals 726 (FIG. 7B). When a drive cell is enabled, a resistive path of a given magnitude is established between each drive cell output (TXOP and TXON in FIG. 7D) and the VDD or VSS supply. When transmitting logic 1 signals (SDP HIGH and SDN LOW), a resistive path is established between TXOP to VDD through resistor R* 728a and conducting PMOS transistor 704 within enabled drive cell element 700a. Similarly, a resistive path is established between TXON to VSS through resistor R* 728b and conducting NMOS transistor 705 within enabled drive cell element 700b. Conversely, when transmitting logic 0 signals (SDP LOW and SDN HIGH), resistive paths are established between TXOP and VSS (through NMOS transistor 705 in enabled drive cell element 700a) and between TXON and VDD (through PMOS transistor 704 in enabled drive cell element 700b). For the simplicity of further discussion, the resistance of any of these paths through R* and an enabled transistor is denoted simply as "R". Note that in the general case the resistive paths do not have to be of equal magnitude but, for simplicity, the following description assumes equal resistive paths. By connecting the outputs of multiple drive cells in parallel, the number of enabled drive cells (marked hereinafter as "D") controls the effective resistance between the transmitter outputs and the supplies, affecting the transmitter output characteristics.

A drive cell is disabled by not asserting the EN (set LOW) and ENB (set HIGH) control signals. When a drive cell is disabled, no resistive paths between the transmitter outputs and the supplies are established because drive cell elements 700a,b are disabled, thus leaving the transmitter output characteristics unaffected.

A parallel termination cell is enabled by asserting its EN control input (set HIGH). When a parallel termination cell is enabled, a parallel resistive termination path through two resistors R* 736a,b and transmission gate 738 is established between TXOP and TXON. For simplicity, the resistance of this path through the two R*s and the enabled transmission gate is denoted simply as 2 R. Transistor scaling can ensure that this occurs reliably. By connecting the outputs of multiple parallel termination cells in parallel, the number of enabled parallel termination cells (marked hereinafter as "PT") controls the effective resistance between the TXOP and TXON outputs, affecting the transmitter output characteristics.

A parallel termination cell is disabled by not asserting its EN control input (set LOW). When a parallel termination cell is disabled, no resistive path between TXOP and TXON is established because the transmission gate 738 is disabled, leaving the transmitter output characteristics unaffected.

Through the combination of drive and parallel termination cells, constructed by connecting the outputs of all cells in parallel, the transmitter output characteristics can be configured by adjusting the number of enabled drive and parallel termination cells (i.e. D and PT).

A drive and a parallel termination cell can be merged into a single, multi-purpose combo cell 740 shown in FIG. 7D. This can be done by adding a transmission gate 746 to the drive cell of FIG. 7B as indicated in FIG. 7D. An enable/disable control signal port (PTEN) 743 is used for the transmission gate. The enable/disable control signal port for the drive cell elements is now labeled DEN/DENB 744. Resistors R* are now numbered 745a,b.

Combo cell 740 can be configured for operation as a drive cell, as a parallel termination cell, or it can be disabled. To configure the combo cell as a drive cell, the DEN and DENB control signals are asserted (DEN HIGH and DENS LOW) and the PTEN control signal is not asserted (PTEN LOW). This enables drive cell elements 700a,b and disables transmission gate 746, and the combo cell behaves like an enabled drive cell. To configure the combo cell as a parallel termination cell, the PTEN control signal is asserted (PTEN HIGH) and the DEN and DENB signals are not asserted (DEN LOW and DENB HIGH). This disables drive cell elements 700a,b, disconnecting an input port 741 from an output port 742, and enables transmission gate 746, causing the combo cell to behave as an enabled parallel termination cell. To disable the combo cell, the DEN, DENS, and PTEN control signals are all not asserted. This disables drive cell elements 700a,b and transmission gate 746, causing the output to be unaffected.

Figure 7E:
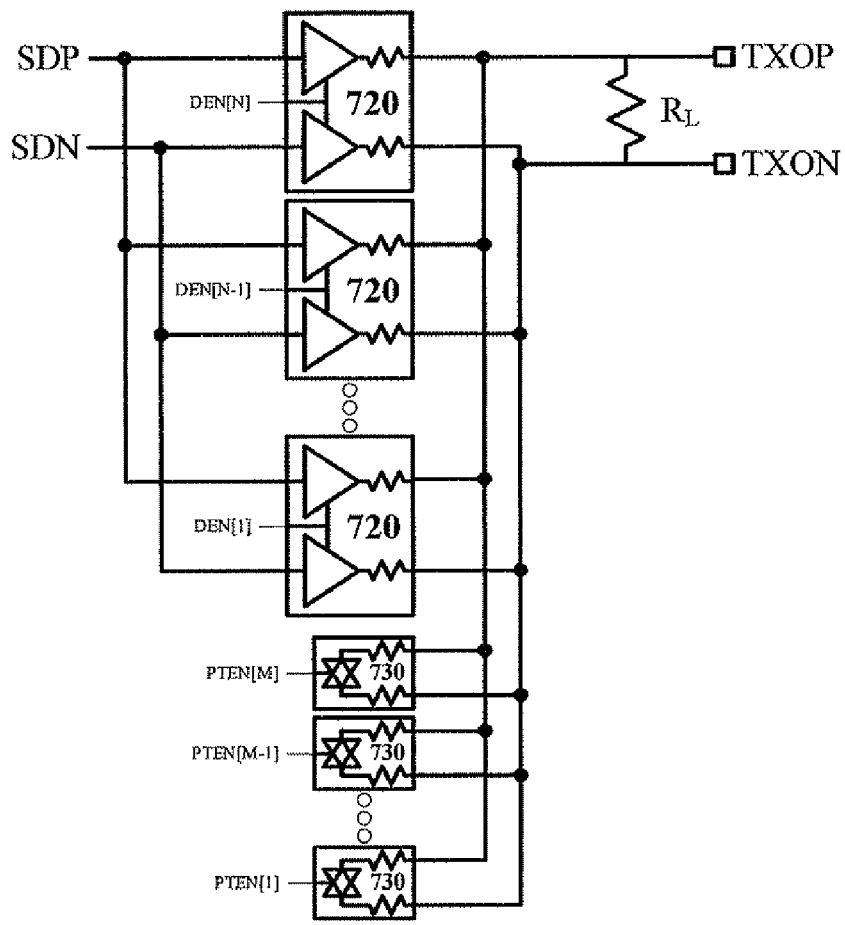
FIG. 7E shows an illustrative configurable VM transmitter constructed from drive and parallel termination cells of the present invention.

An illustrative configurable VM transmitter that includes N drive cells 720 and M parallel termination cells 730 is shown in FIG. 7E. The outputs of all cells are connected in parallel, and the inputs of all the drive cells are connected in parallel. Each drive cell has a separate enable signal DEN[x], where x ranges from 1 to N. Similarly, each parallel termination cell has a separate enable signal PTEN[x], where x ranges from 1 to M.

Figure 7F:
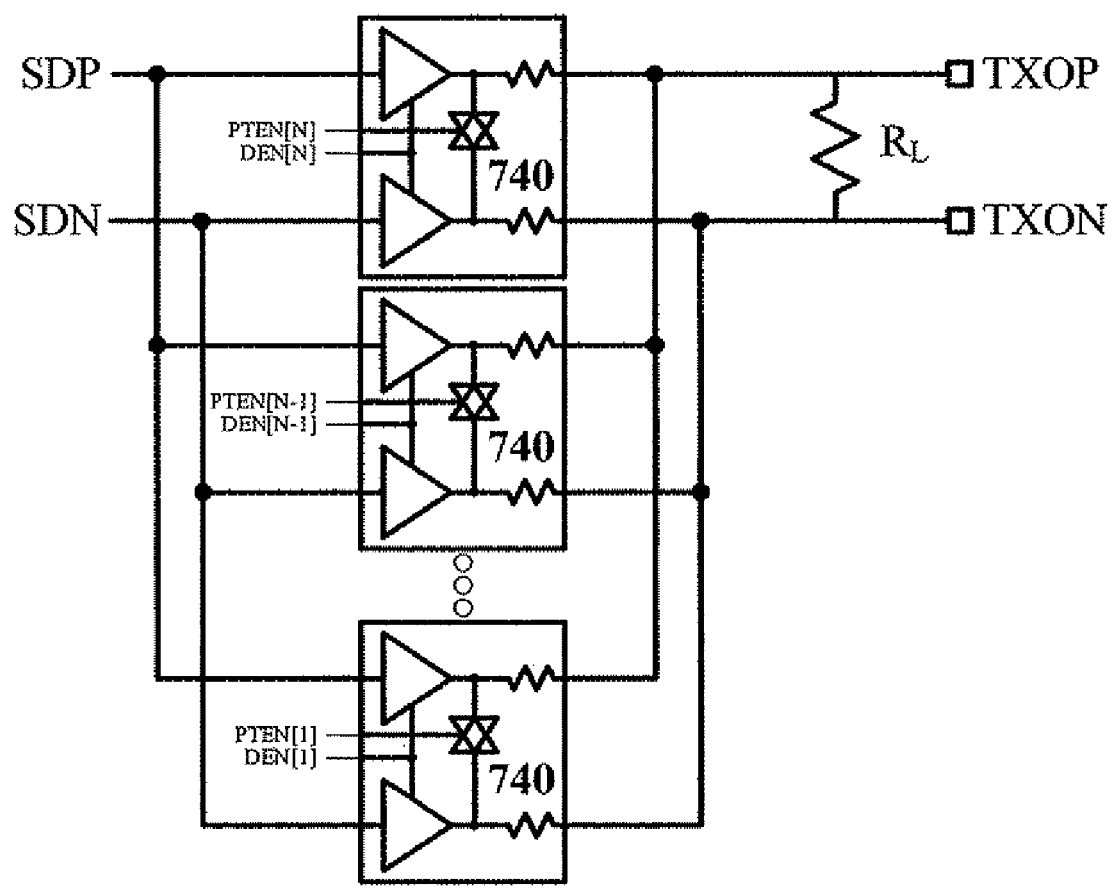
FIG. 7F shows an illustrative configurable VM transmitter constructed from drive/parallel termination combination cells of the present invention.

An alternative illustration of a configurable VM transmitter is shown in FIG. 7F using N combo cells 740. The inputs and outputs of each combo cell are connected in parallel, respectively. Each combination cell has both a drive mode enable signal DEN[x] and a parallel termination mode enable signal PTEN[x], where x ranges from 1 to N.

Note that, in the general case, any combination of drive, parallel termination, and combo cells can be arranged in a fashion similar to FIG. 7 to form a configurable VM transmitter.

The output characteristics of a configurable VM transmitter of the present invention are determined by the number D of enabled drive cells and the number PT of enabled parallel termination cells. The equivalent resistive paths between the supplies and the transmitter outputs become R/D and the internal parallel termination between the transmitter outputs becomes 2 R/PT. When loaded by an external termination resistor $R_L$, the transmitter output characteristics are expressed in Table 3 and presented alongside the corresponding results for conventional VM transmitters from Table 1.

TABLE 3

| | VM Transmitter Structure | |
|---|---|---|
| Parameter | Conventional | Configurable |
| $R_{O_{diff}}$ | $R_T \| 2R$ | $\dfrac{2R}{D+PT}$ |
| $V_{O_{diff}}$ | $2 \cdot VDD \cdot \dfrac{R_T}{R_T + 2R} \cdot \dfrac{R_L}{R_L + R_{O_{diff}}}$ | $2 \cdot VDD \cdot \dfrac{D}{D+PT} \cdot \dfrac{R_L}{R_L + R_{O_{diff}}}$ |
| $R_{CM}$ | $\dfrac{R}{2}$ | $\dfrac{R}{2D}$ |
| $V_{CM}$ | $\dfrac{VDD}{2}$ | $\dfrac{VDD}{2}$ |

In the simplest form of a configurable VM transmitter of the present invention using drive and parallel termination cells, the transmitter would comprise a single drive cell that would always be enabled (i.e. D=1), and a single parallel termination cell that could either be enabled or disabled (i.e. PT=0, or PT=1). Assuming that VDD is 1V, $R_L$ is 100 Ohm, and R is 100 Ohm, the characteristics of the transmitter for the configurations PT=0 and PT=1 are tabulated in Table 3A.

TABLE 3A

| Parameter | PT = 0 | PT = 1 |
|---|---|---|
| $R_{O_{diff}}$ | 200 Ohm | 100 Ohm |
| $V_{O_{diff}}$ | 667 mV | 500 mV |
| $R_{CM}$ | 50 Ohm | 50 Ohm |
| $V_{CM}$ | 500 mV | 500 mV |

Operating Methodologies

There are two general methodologies for operating the configurable VM transmitter architecture in standardized applications. In a controlled impedance methodology, the differential output impedance of the transmitter is set to match the load through selection of the quantity D+PT for a given R and $R_L$. Adjusting the differential output swing then becomes a matter of adjusting the number of enabled drive and parallel termination cells (i.e. D and PT) while keeping the total number of enabled drive and parallel termination cells (i.e. D+PT) constant.

In an overdrive methodology, the parallel termination cells are all disabled, and the differential output impedance is set to be smaller than $R_L$ by using a sufficiently large number D of drive cells. Expressions for the differential output swings of these two operating methodologies are given in Table 4A. An exemplary sufficiency criterion, referring to the expressions in Table 4A, is D>(2 R)/RL. In this manner, the open-circuit voltage is maintained at VDD, and the voltage divider between the differential output resistance and $R_L$ is skewed in favor of $R_L$.

TABLE 4A

| | | |
|---|---|---|
| (a) | $V_{O_{diff}} = VDD \cdot \dfrac{D}{D+PT}$; | $R_{O_{diff}} = R_L$ |
| (b) | $V_{O_{diff}} = 2 \cdot VDD \cdot \dfrac{R_L}{R_L + R_{O_{diff}}}$; | $R_{O_{diff}} = \dfrac{2R}{D} < R_L$ |

The maximum differential swing available from the controlled impedance methodology is VDD, and is largely obtained through adjustment of the open-circuit voltage with an equal voltage divider split between the differential output resistance and the load resistor (i.e. a ratio of 0.5). For the overdrive methodology, the voltage divider ratio between $R_L$ and $P_{O_{diff}}$ becomes greater than 0.5, resulting in a differential output swing greater than VDD. This increased swing comes at the expense of degraded return loss.

For example, consider a configurable VM transmitter with 8 drive cells and 3 parallel termination cells, and assume that VDD is 1V, $R_L$ is 100 Ohm, and R is 200 Ohm. To operate with the controlled impedance methodology the total number of enabled drive and parallel termination cells (D+PT) should be 4, which will make the differential output impedance of the transmitter 100 Ohm to match the load. Under the constraint that D+PT=4, the possible configurations of the transmitter in the controlled impedance methodology are tabulated in Table 4B:

TABLE 4B

| Parameter | D = 4, PT = 0 | D = 3, PT = 1 | D = 2, PT = 2 | D = 1, PT = 3 |
|---|---|---|---|---|
| $R_{O_{diff}}$ | 100 Ohm | 100 Ohm | 100 Ohm | 100 Ohm |
| $V_{O_{diff}}$ | 1000 mV | 750 mV | 500 mV | 250 mV |
| $R_{CM}$ | 25 Ohm | 33.3 Ohm | 50 Ohm | 100 Ohm |
| $V_{CM}$ | 500 mV | 500 mV | 500 mV | 500 mV |

The overdrive methodology can be employed by disabling all the parallel termination cells (PT=0) and increasing the number of enabled drive cells (D) above 4. The possible configurations of the transmitter in the overdrive methodology are tabulated in Table 4C:

TABLE 4C

| Parameter | D = 5 | D = 6 | D = 7 | D = 8 |
|---|---|---|---|---|
| $R_{O_{diff}}$ | 80 Ohm | 66.7 Ohm | 57.1 Ohm | 50 Ohm |
| $V_{O_{diff}}$ | 1111.1 mV | 1200 mV | 1272.7 mV | 1333.3 mV |
| $R_{CM}$ | 20 Ohm | 16.7 Ohm | 14.3 Ohm | 12.5 Ohm |
| $V_{CM}$ | 500 mV | 500 mV | 500 mV | 500 mV |

Pre-Emphasis

Figure 7G:
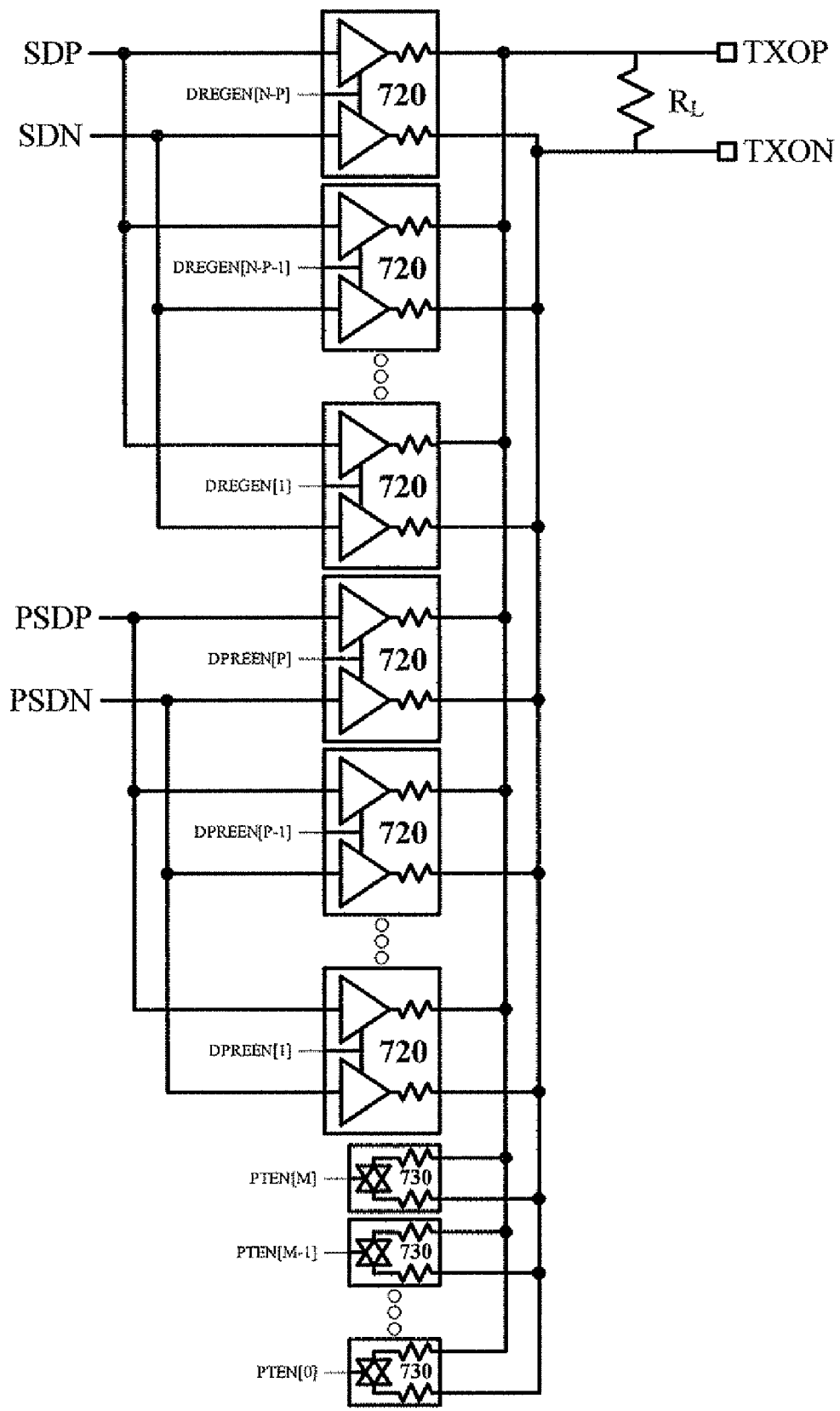
FIG. 7G shows an illustrative configurable VM transmitter with pre-emphasis implemented, constructed from drive and parallel termination cells of the present invention.

A basic implementation of pre-emphasis with the configurable VM transmitter architecture follows the discussion above. Consider for example FIG. 7G. This figure is derived from FIG. 7E, in which there were N drive cells 720, all with inputs connected in parallel to the serial data to be transmitted (SDP/SDN). To implement pre-emphasis as illustrated in FIG. 7G, the collection of drive cells are split into two banks—one bank of N-P drive cells dedicated for regular drive and one bank of P drive cells dedicated for pre-emphasis drive. The regular drive cells have their inputs connected in parallel to the SDP/SDN inputs, whereas the pre-emphasis drive cells have their inputs connected in parallel to a pre-emphasis serial data (PSDP/PSDN) input. The enable signals for the drive cells of the regular drive and pre-emphasis drive become DREGEN[x] and DPREEN[y], respectively, where x ranges from 1 to N-P and y ranges from 1 to P. The M parallel termination cells (710) serve the same purpose as in FIG. 7E.

Operationally, the number of enabled drive cells (previously D) is split into a number of enabled drive cells dedicated for regular drive (DREG) and a number of enabled drive cells dedicated for pre-emphasis drive (DPRE). The number of enabled parallel termination cells is PT, $R_{REG}$ can now be expressed as R/DREG, $R_{PRE}$ is equal to R/DPRE, and $R_T$ is equal to 2R/PT. The output characteristics of the transmitter, when driving emphasized and non-emphasized bits is summarized in Table 5.

TABLE 5

| Parameter | Emphasized Bits | Non-Emphasized Bits |
|---|---|---|
| $R_{O_{diff}}$ | $\dfrac{2R}{DREG + DPRE + PT}$ | $\dfrac{2R}{DREG + DPRE + PT}$ |
| $V_{O_{diff}}$ | $2 \cdot VDD \cdot \dfrac{DREG + DPRE}{DREG + DPRE + PT} \cdot \dfrac{R_L}{R_L + R_{O_{diff}}}$ | $2 \cdot VDD \cdot \dfrac{DREG - DPRE}{DREG + DPRE + PT} \cdot \dfrac{R_L}{R_L + R_{O_{diff}}}$ |
| $R_{CM}$ | $\dfrac{R}{2(DREG + DPRE)}$ | |
| $V_{CM}$ | $\dfrac{VDD}{2}$ | |

The PER for a configurable VM transmitter can then be expressed as in Equation 5.

$$PER = \frac{DREG - DPRE}{DREG + DPRE} \quad (5)$$

The expression for the effective resistance between VDD and VSS for the cases of driving an emphasized bit and a non-emphasized bit ($R_E$ and $R_{NE}$) are summarized in Equation 6.

$$R_E = \frac{2R}{DREG + DPRE} + \frac{R}{PT} \bigg\| R_L \quad (6)$$

$$R_{NE} = \frac{R_E}{\left[ 1 + \dfrac{2\left(\dfrac{R}{PT} \| R_L\right)}{\dfrac{R}{DREG} + \dfrac{R}{DPRE}} \right]}$$

A second embodiment of the configurable VM transmitter of the present invention is now described with reference to FIG. 8. This second embodiment discloses a configurable VM transmitter architecture that includes additional elements and functionalities over the first embodiment: the addition of common-mode level control, and the addition of common-mode impedance control. This second embodiment can be constructed from combinations of the drive and parallel termination cells of the first embodiment and with two new types of cells: a pull-up cell 800 shown in FIG. 8A and a pull-down cell 810 shown in FIG. 8B. As with the drive and parallel termination cells, the pull-up and pull-down cells can be enabled or disabled.

Figure 8A:
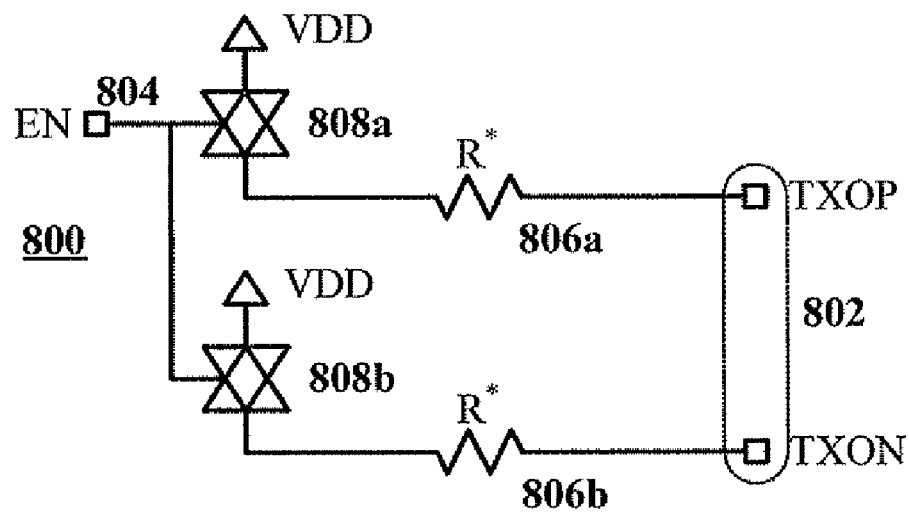
FIG. 8A shows a pull-up cell of the present invention.

An exemplary pull-up cell 800 includes two resistors R* 806a,b and two transmission gates 808a,b connected to an output port 802 and an enable/disable control signal port 804 as indicated in FIG. 8A.

With reference to FIG. 8A, a pull-up cell is enabled by asserting the EN (set HIGH) control signal. When a pull-up cell is enabled, a resistive path of a given magnitude is established between each transmitter output (TXOP and TXON) and the VDD supply through resistors R* 806a,b and the effective on-resistances of enabled transmission gates 808a,b. For the simplicity of further discussion, the resistance of these paths through R* and the enabled transmission gate is denoted simply as R. By connecting the outputs of multiple pull-up cells in parallel, the number of enabled pull-up cells controls the effective resistance between each transmitter output and VDD, affecting the transmitter output characteristics.

A pull-up cell is disabled by not asserting the EN (set LOW) control signal. When a pull-up cell is disabled, no resistive paths between each transmitter output and the VDD supply are established because the transmission gates 808a,b are not conducting, leaving the transmitter output characteristics unaffected.

Figure 8B:
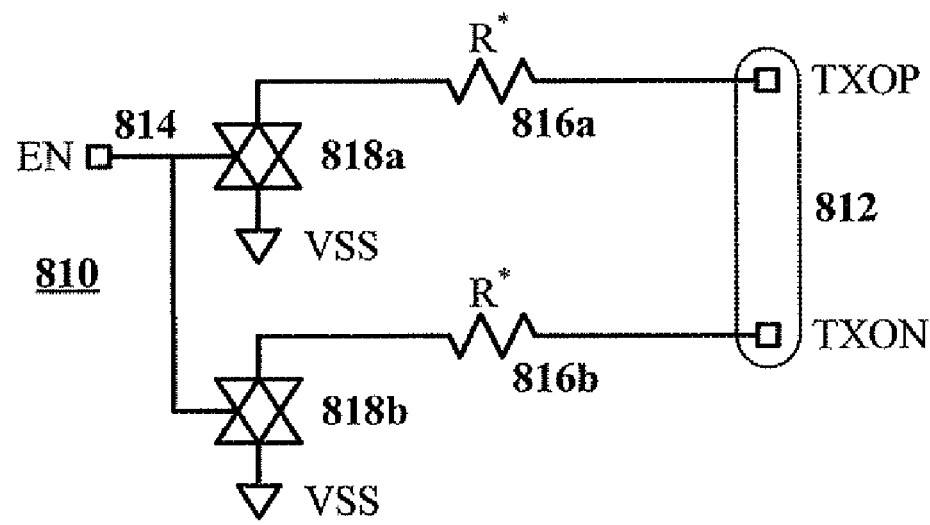
FIG. 8B shows a pull-down cell of the present invention.

An exemplary pull-down cell 810 includes two resistors R* 816a,b and two transmission gates 818a,b connected to an output port 812 and an enable/disable control signal port 814 as indicated in FIG. 8B.

With reference to FIG. 8B, a pull-down cell is enabled by asserting the EN (set HIGH) control signal. When a pull-down cell is enabled, a resistive path of a given magnitude is established between each transmitter output (TXOP and TXON) and the VSS supply through resistors R* 816a,b and the effective on-resistances of enabled transmission gates 818a,b. For the simplicity of further discussion, the resistance of these paths through R* and the enabled transmission gate is denoted simply as R. By connecting the outputs of multiple pull-down cells in parallel, the number of enabled pull-down cells controls the effective resistance between each transmitter output and VSS, affecting the transmitter output characteristics.

A pull-down cell is disabled by not asserting the EN (set LOW) control signal. When a pull-down cell is disabled, no resistive paths between each transmitter output and the VDD supply are established because the transmission gates 818a,b are not conducting, leaving the transmitter output characteristics unaffected.

Through the combination of drive, parallel termination, pull-up, and pull-down cells, and constructed by connecting the outputs of all cells in parallel, the transmitter output characteristics can be configured by adjusting the number of enabled drive, parallel termination, pull-up, and pull-down cells.

Figure 8C:
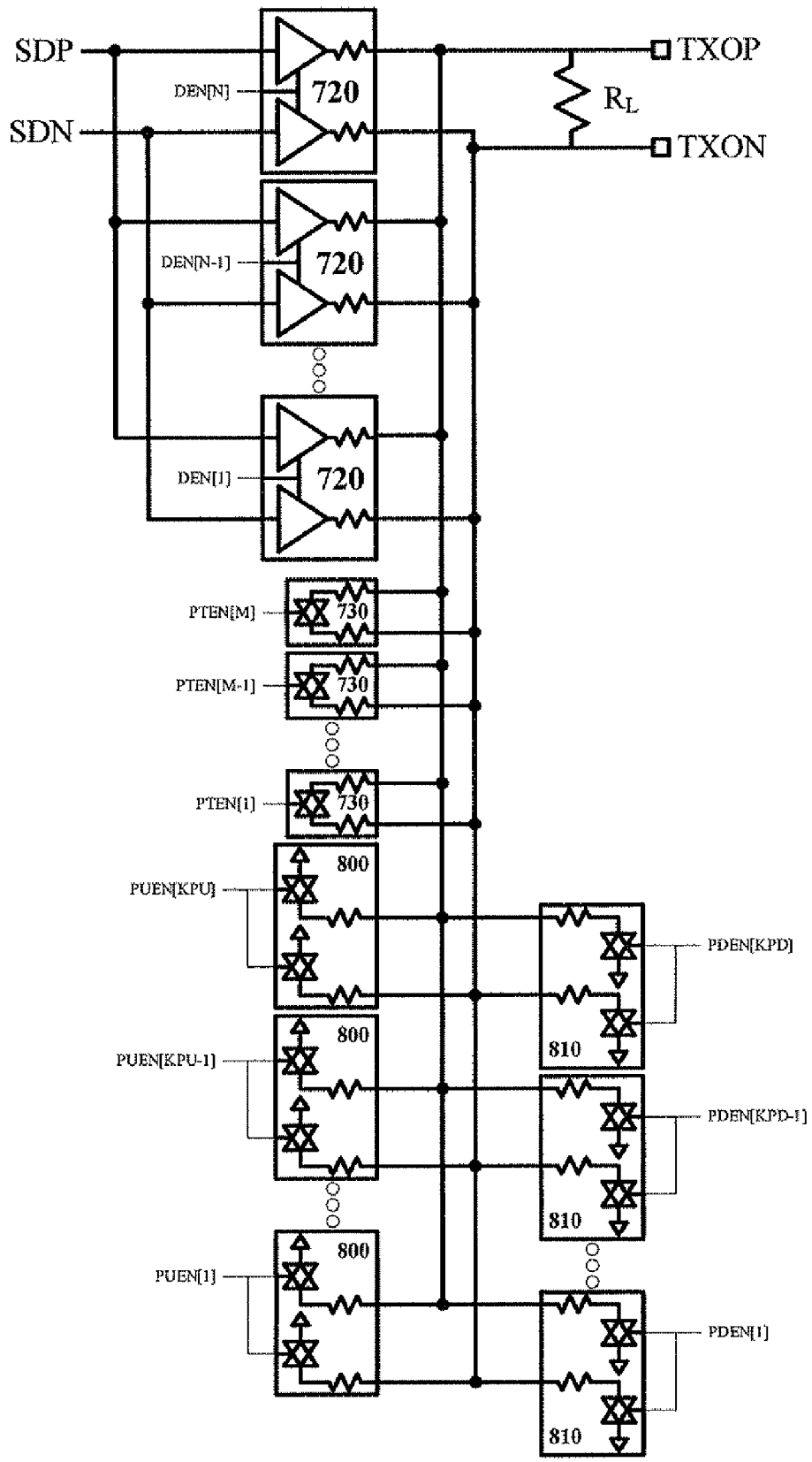
FIG. 8C shows an illustrative configurable VM transmitter with pull-up and pull-down functions, constructed from drive and parallel termination cells and pull-up and pull-down cells of the present invention.

An illustrative configurable VM transmitter with pull-up and pull-down functions is shown in FIG. 8C. FIG 8C is derived from FIG. 7D, with an additional KPU pull-up cells and KPD pull-down cells added in parallel with the drive and parallel termination cells. Each pull-up cell has a separate enable signal PUEN[x], where x ranges from 1 to KPU. Similarly, each pull-down cell has a separate enable signal PDEN[x], where x ranges from 1 to KPD.

Figure 9:
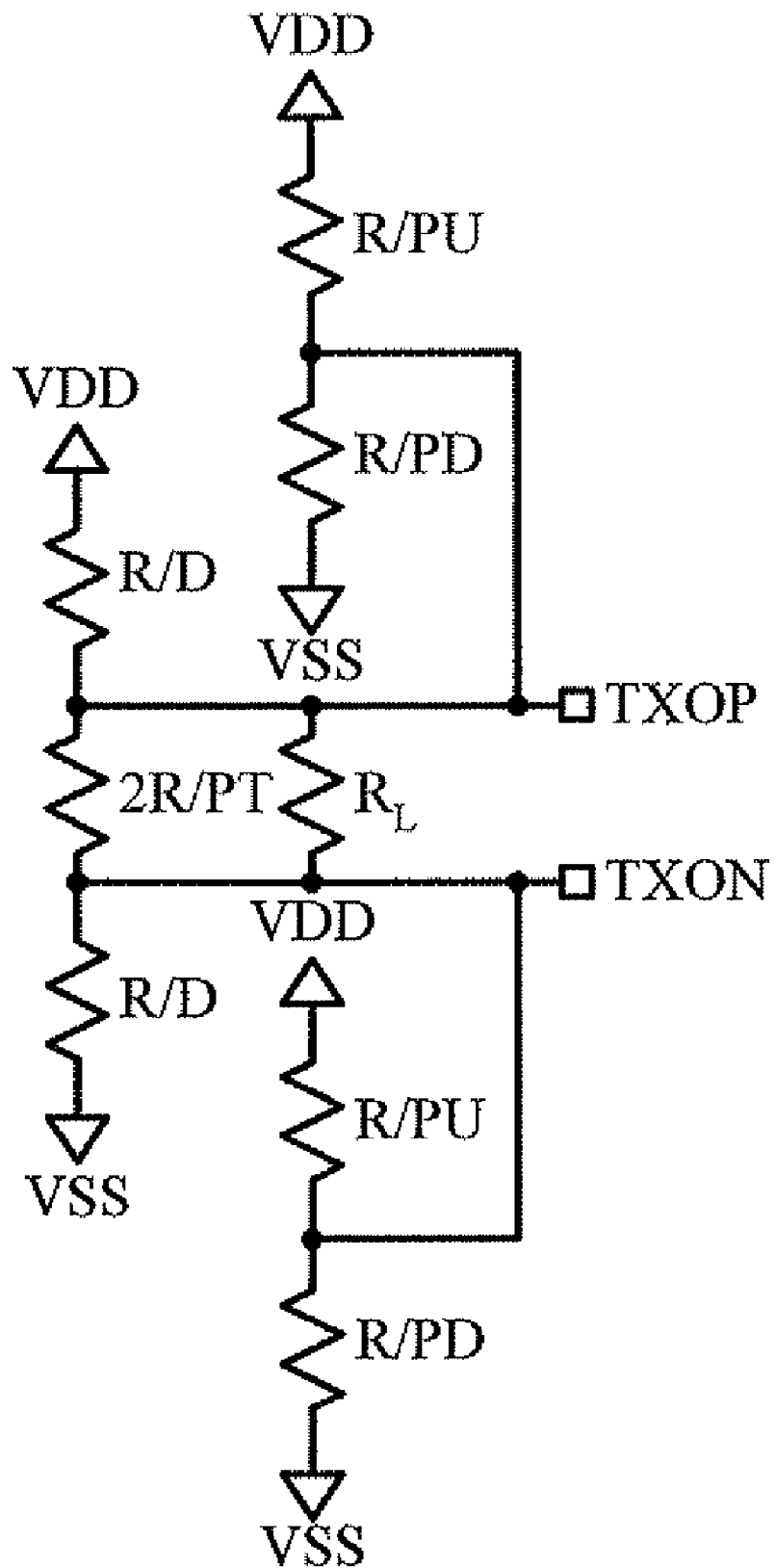
FIG. 9 shows resistive paths in a configurable VM transmitter architecture with common-mode adjustment extension.

If the number of enabled drive cells is denoted D, the number of enabled parallel termination cells is denoted PT, and the number of enabled pull-up and pull-down cells is denoted PU and PD, respectively, then the established resistive paths between VDD, VSS, and TXOP and TXON, loaded by a resistor $R_L$ when logic 1 is being transmitted is illustrated in FIG. 9. The differential and common-mode output characteristics of the second embodiment configuration are given in Equation 7. The derivative of $V_{CM}$ with respect to PU and PD is given in Equation 8.

$$R_{O_{diff}} = \frac{2R}{D + PT + PU + PD} \quad (7)$$

$$V_{O_{diff}} = 2 \cdot VDD \cdot \frac{D}{D + PT + PU + PD} \cdot \frac{R_L}{R_L + R_{O_{diff}}}$$

$$R_{CM} = \frac{R}{2(D + PU + PD)}$$

$$V_{CM} = \frac{VDD}{2} \cdot \frac{D + 2PU}{D + PU + PD}$$

$$\frac{\partial V_{CM}}{\partial PU} = -\frac{\partial V_{CM}}{\partial PD} = \frac{VDD}{2} \cdot \frac{D + 2PD}{(D + PU + PD)^2} \quad (8)$$

The operating methodologies and the characteristics for this modified transmitter architecture are similar to those outlined for the basic architecture of the first embodiment (see Table 3), with the parameter PT replaced by PT+PU+PD.

It is apparent from Equations 7 and 8 that $V_{CM}$ can be adjusted symmetrically about VDD/2 through adjustment of either PU or PD. To maintain constant $V_{O_{diff}}$ and $R_{O_{diff}}$, PT would have to be reduced (increased) in conjunction with any increase (reduction) in PU or PD. By keeping D+PU+PD constant adjustment of $R_{CM}$ can be independent of $R_{O_{diff}}$.

For example, consider a configurable VM transmitter with 4 drive cells, 3 parallel termination cells, 2 pull-up cells and 2 pull-down cells, and assume that VDD is 1 Volt, $R_L$ is 100 Ohm, and R is 200 Ohm. To operate with the controlled impedance methodology the total number of enabled drive, parallel termination, and pull-up and pull-down cells (D+PT+PU+PD) should be 4, which will make the differential output impedance of the transmitter 100 Ohm to match the load. Under the constraint that D+PT+PU+PD=4, some of the possible configurations of the transmitter in the controlled impedance methodology are tabulated in Table 5A.

TABLE 5A

| Parameter | D = 4<br>PT = 0<br>PU = 0<br>PD = 0 | D = 2<br>PT = 2<br>PU = 0<br>PD = 0 | D = 2<br>PT = 1<br>PU = 1<br>PD = 0 | D = 2<br>PT = 0<br>PU = 2<br>PD = 0 |
|---|---|---|---|---|
| $R_{O_{diff}}$ | 100 Ohm | 100 Ohm | 100 Ohm | 100 Ohm |
| $V_{O_{diff}}$ | 1000 mV | 500 mV | 500 mV | 500 mV |
| $R_{CM}$ | 25 Ohm | 50 Ohm | 33.3 Ohm | 25 Ohm |
| $V_{CM}$ | 500 mV | 500 mV | 666.7 mV | 750 mV |

The addition of pull-up and pull-down functions to a configurable VM transmitter with a basic pre-emphasis function is similarly straightforward through the analogous addition of pull-up or pull-down cells to the VM transmitter of FIG. 7F.

Alternative Pre-Emphasis Architecture

An alternative pre-emphasis architecture embodiment of the configurable VM transmitter of the present invention is now described with reference to FIGS. 10 and 11. This embodiment discloses a configurable VM transmitter architecture that implements the pre-emphasis function in a different manner.

Figure 10A:
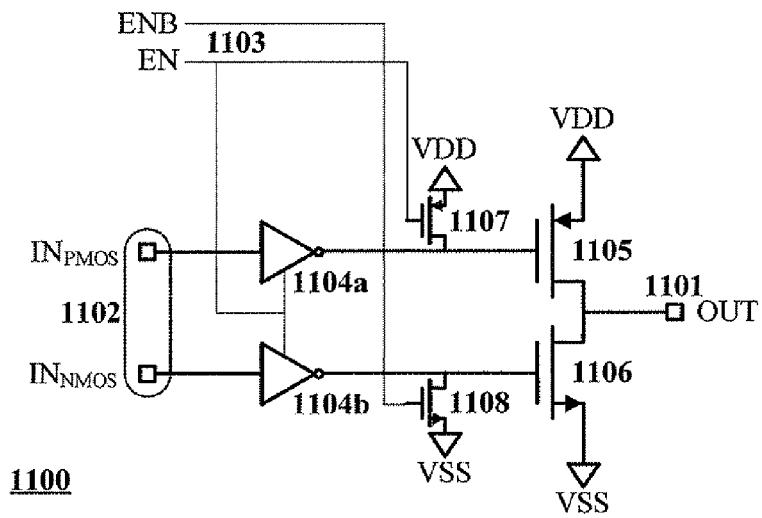
FIG. 10A shows an illustrative pre-emphasis drive cell element for an alternative pre-emphasis architecture.
Figure 10B:
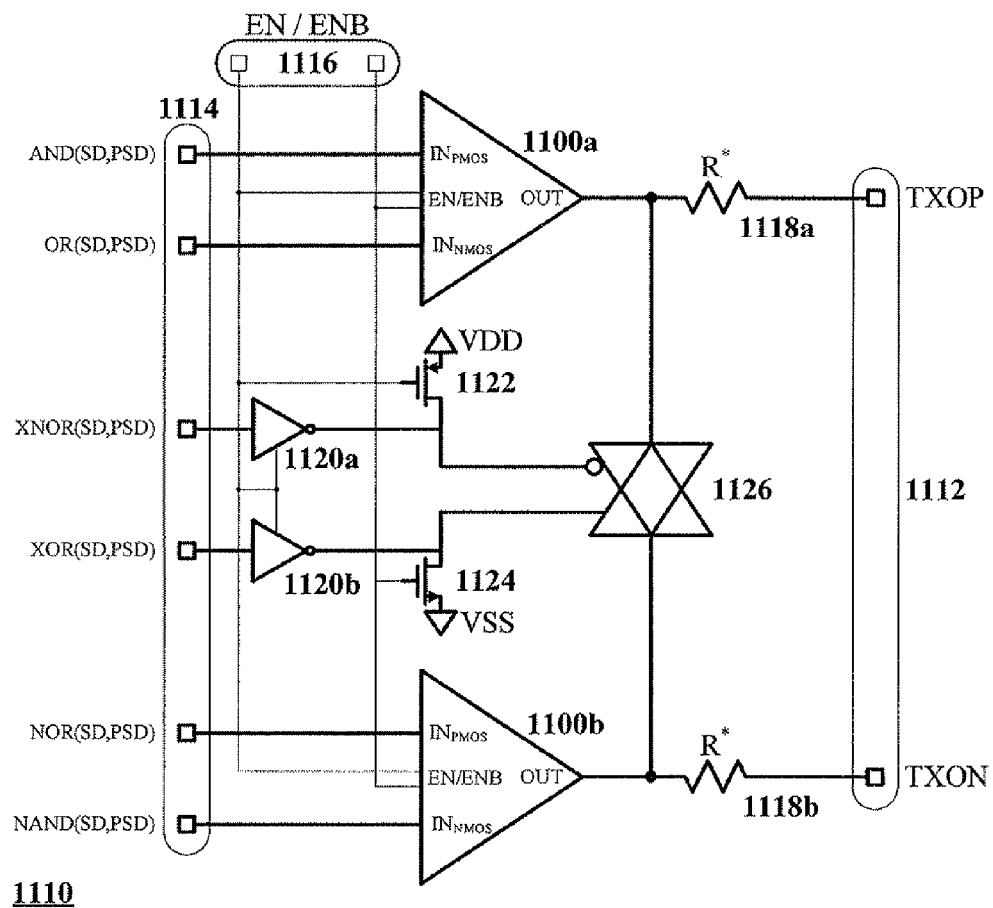
FIG. 10 shows an illustrative pre-emphasis cell for an alternative pre-emphasis architecture.
FIG. 10C shows an illustrative configurable VM transmitter with an alternative pre-emphasis architecture, constructed from drive and parallel termination cells and pre-emphasis drive cells of the present invention.
Figure 10C:
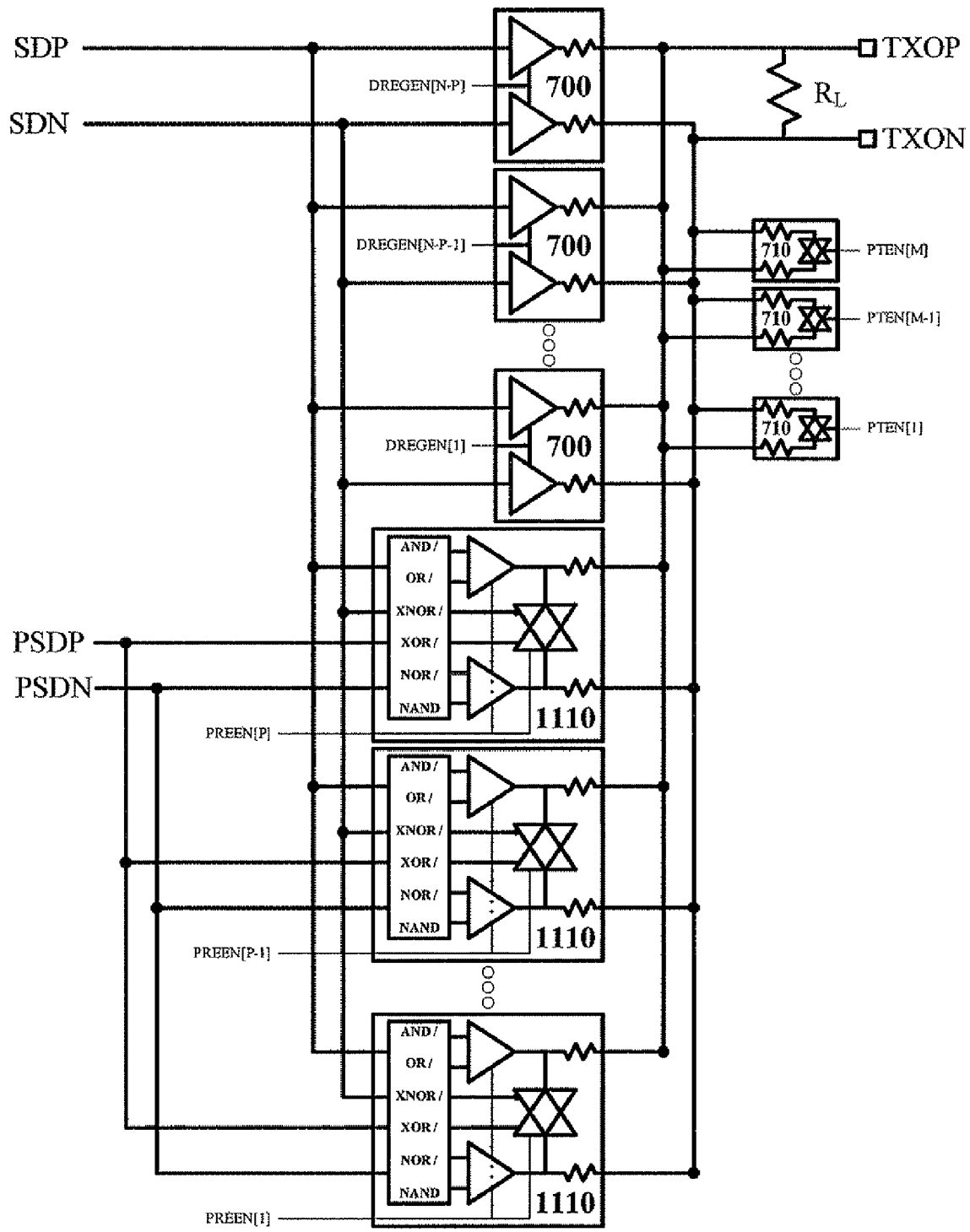

This embodiment can be constructed from combinations of the drive and parallel termination cells of the first (basic) embodiment, and with a new type of pre-emphasis unit cell 1110 shown in FIG. 10B. As with the other unit cells of the present invention, the pre-emphasis cells can be enabled or disabled. With reference to FIG. 10C and by way of comparison to FIG. 7F, the P drive cells dedicated for pre-emphasis drive in FIG. 7F are replaced by pre-emphasis unit cells 1110. A pre-emphasis unit cell 1110 has an input port that makes use of signals derived from both the serial data stream (SDP and SDN) and the pre-emphasis serial data stream (PSDP and PSDN).

An exemplary pre-emphasis unit cell 1110 includes (FIG. 10B) two pre-emphasis drive cell elements 1100a,b, an output port 1112, an input port 1114, an enable/disable control signal port 1116, two resistors R* 1118a,b, two tri-state inverters 1120a,b, a pull-up PMOS transistor 1122, a pull-down NMOS transistor 1124 and a transmission gate 1126, interconnected as shown.

Each pre-emphasis drive cell element 1100 includes (FIG. 10A) an output port 1101, an input port 1102, an enable/disable control signal port EN/ENB 1103, two tri-state inverters 1104a,b, a pull-up PMOS transistor 1107, a pull-down NMOS transistor 1108 and an inverter-like structure formed by a PMOS transistor 1105 and an NMOS transistor 1106, interconnected as shown in FIG. 10A. The inverter-like structure has separate inputs for the PMOS 1105 and NMOS 1106 transistors, unlike a conventional inverter.

When the pre-emphasis drive cell element is enabled (EN HIGH, ENB LOW), tri-state inverters 1104a,b are enabled and pull-up PMOS transistor 1107 and pull-down NMOS transistor 1108 are disabled. This allows tri-state inverter 1104a to drive PMOS transistor 1105 and tri-state inverter 1104b to drive NMOS transistor 1106 and affect the output port.

When the pre-emphasis drive cell element is disabled (EN LOW, ENB HIGH), the tri-state inverters are disabled, disconnecting the input port from the rest of the pre-emphasis drive cell element. Further, the pull-up PMOS 1107 and pull-down NMOS 1108 transistors are enabled, causing the inverter-like structure to have its PMOS transistor 1105 gate terminal pulled to VDD and its NMOS transistor 1106 gate terminal pulled to VSS, disabling both transistors and disconnecting the pre-emphasis drive cell element from the output port, leaving the output port unaffected.

With reference to FIG. 10A, pre-emphasis unit cell 1110 is enabled by asserting the EN (set HIGH) and ENB (set LOW) control signals. When the pre-emphasis cell is enabled, pre-emphasis drive cell elements 1100a,b and tri-state inverters 1120a,b are enabled, whereas pull-up PMOS transistor 1122 and pull-down NMOS transistor 1124 are disabled. This permits the pre-emphasis cell to be dynamically configured to operate in a manner similar to a drive cell or as a parallel termination cell, depending on the nature of the SDP/N and PSDP/N inputs at any given time. The input port label AND (SD,PSD) indicates a derived signal obtained by logically ANDing the SD and PSD data streams. The OR(SD,PSD), NOR(SD,PSD), NAND(SD,PSD), XOR(SD,PSD) and XNOR(SD,PSD) labels indicate similarly derived signals by performing logical OR, NOR, NAND, XOR, and XNOR operations, respectively, on the SD and PSD data streams. This arrangement of derived data signals automatically achieves the desired operational function of pre-emphasis unit cell 1110. The AND/NAND functions identify emphasized '1' bits, enable the PMOS 1105 of the pre-emphasis drive cell element 1100a driving the TXOP output and enable the NMOS 1106 of the pre-emphasis drive cell element 1100b driving the TXON output. For bits other than emphasized '1' bits, these same transistors are disabled. Similarly, the OR/NOR functions identify emphasized '0' bits, enable NMOS transistor 1106 of pre-emphasis drive cell element 1100a to drive the TXOP output and enable the PMOS transistor 1105 of pre-emphasis drive cell element 1100b to drive the TXON output. For bits other than emphasized '0' bits, these same transistors are disabled. Similarly, the XOR/XNOR functions identify non-emphasized bits and enable transmission gate 1126. For bits other than non-emphasized bits, transmission gate 1126 is disabled.

Thus, when driving emphasized bits, an enabled pre-emphasis cell behaves in a manner similar to a drive cell, resulting in constructive interference with the drive unit cells. When driving non-emphasized bits, an enabled pre-emphasis cell behaves in a manner similar to a parallel termination cell, resulting in destructive interference with the drive cells. By connecting the outputs of multiple pre-emphasis cells in parallel, the number of enabled pre-emphasis cells (marked hereinafter as "PRE") controls the degree of constructive and destructive interference when either emphasizing or de-emphasizing bits, affecting the transmitter pre-emphasis output characteristics.

A pre-emphasis cell is disabled by not asserting the EN (set LOW) and ENB (set HIGH) control signals. When a pre-emphasis cell is disabled, both pre-emphasis drive cell elements are disabled, both tri-state inverters 1120a,b are disabled, and pull-up PMOS transistor 1122 and pull-down NMOS transistor 1124 are enabled, disabling the transmission gate. This results in the output port 1112 being disconnected from the rest of the pre-emphasis unit cell, and leaving the transmitter characteristics unaffected regardless of the inputs SDP/N and PSDP/N.

With reference to FIG. 10C, which is derived from FIG. 7F, a configurable VM transmitter includes N-P drive cells 700, M parallel termination cells 710, and P pre-emphasis unit cells 1100. The M parallel termination cells and N-P drive cells serve the same purpose as in FIG. 7F for the configurable VM transmitter architecture with a pre-emphasis implementation The SDP and SDN inputs are connected to both the input ports of the drive cells and to the input port of the pre-emphasis unit cells, and the PSDP and PSDN inputs are connected to the input port of the pre-emphasis unit cells. The output ports of all the unit cells are connected in parallel. Similarly, the enable signals for the drive cells, pre-emphasis cells, and the parallel termination cells are connected to DREGEN[x], PREEN[y], and PTEN[z], respectively, where x ranges from 1 to N-P, y ranges from 1 to P, and z ranges from 1 to M.

Note that although the pre-emphasis unit cells 1110 illustrated in FIG. 10C are drawn as having two input ports (for SDP/SDN and PSDP/PSDN) with the logical AND/OR/XNOR/XOR/NOR/NAND signals derived from SDP/SDN and PSDP/PSDN internal to the unit cell, it should be appreciated that this is not an essential aspect of the pre-emphasis unit cell. The logical AND/OR/XNOR/XOR/NOR/NAND signals may be commonly derived outside of the pre-emphasis unit cells, and provided as dedicated inputs to the pre-emphasis unit cells. In this alternative arrangement of inputs and generation of logical derived signals, the function of the pre-emphasis unit cell remains fundamentally the same.

Note also that the description of this third embodiment thus far has specifically referred to the implementation of post-cursor pre-emphasis, whereas in the general case any form of pre-emphasis could be implemented.

Finally, it should be appreciated that the addition of pull-up and pull-down functions to the configurable VM transmitter of this third embodiment is straightforward through the addition of pull-up and pull-down cells to the VM transmitter of FIG. 10.

Operationally, similar to the first embodiment with pre-emphasis, the number of enabled drive cells (used for regular drive) is DREG, the number of enabled pre-emphasis unit cells (to drive emphasized bits, or serve as parallel termination for non-emphasized bits) is PRE, and the number of enabled parallel termination cells is PT. In this case, with reference to the expression for $V_{Odiff}$ in Table 3 for the configurable VM transmitter with basic pre-emphasis, for emphasized bits, parameter D is replaced by DREG+PRE; for non-emphasized bits, parameter PT is replaced by PT+PRE.

Table 6 lists the output characteristics of the alternative pre-emphasis architecture when driving emphasized and non-emphasized bits.

TABLE 6

| Parameter | Emphasized Bits | Non-Emphasized Bits |
|---|---|---|
| $R_{O_{diff}}$ | $\dfrac{2R}{(DREG+PRE)+PT}$ | $\dfrac{2R}{DREG+(PT+PRE)}$ |
| $V_{O_{diff}}$ | $2 \cdot VDD \cdot \dfrac{(DREG+PRE)}{(DREG+PRE)+PT} \cdot \dfrac{R_L}{R_L+R_{O_{diff}}}$ | $2 \cdot VDD \cdot \dfrac{DREG}{DREG+(PT+PRE)} \cdot \dfrac{R_L}{R_L+R_{O_{diff}}}$ |
| $R_{CM}$ | $\dfrac{R}{2(DREG+PRE)}$ | $\dfrac{R}{2DREG}$ |
| $V_{CM}$ | $\dfrac{VDD}{2}$ | $\dfrac{VDD}{2}$ |

The pre-emphasis ratio for the alternative pre-emphasis architecture of the third embodiment is given in Equation 9.

$$PER = \frac{DREG}{DREG+PRE} \qquad (9)$$

It is important to note that the method of configuring this alternative pre-emphasis architecture (i.e. number of enabled drive, parallel termination, and pre-emphasis cells) to achieve a given PER is different from the basic architecture. In the basic architecture, the emphasized and non-emphasized voltage swings are set by DREG+DPRE and DREG−DPRE, respectively. For this alternative architecture, they are set by DREG+PRE and DREG, respectively. The parameters for the two architectures are compared in Equation 10. The ALT and BASIC subscripts refer to the alternative and basic architectures, respectively $$DREG_{ALT}=DREG_{BASIC}-DPRE_{BASIC}$$

$$PRE_{ALT}=2 \cdot DPRE_{BASIC} \qquad (10)$$

From Equation 10, it can be seen that the basic architecture requires more regular drive cells and the alternative architecture requires more pre-emphasis cells. The total number of enabled drive and/or pre-emphasis cells remains constant for the two architectures, however. The expressions for the effective resistance between VDD and ground for the cases of driving an emphasized bit and a non-emphasized bit ($R_E$ and $R_{NE}$) for both the basic and alternative pre-emphasis architectures is given in Table 7.

In view of Equation 10, the $R_E$ expressions in Table 7 are equivalent, implying that the power dissipated when emphasizing a bit is the same for both the basic and alternative architectures. However, unlike the case for the basic pre-emphasis architecture, in which $R_{NE}$ is necessarily always smaller than $R_E$, $R_{NE}$ may be either larger or smaller than $R_E$ for the alternative pre-emphasis architecture, depending on the relative magnitudes of DREG, PRE, and PT. Consider, for example, the case where one is operating with the controlled impedance methodology, in which the load resistance and differential output resistance of the transmitter are matched [$2R=R_L \times (DPRE+PRE+PT)$]. In this case, the ratio $R_E/R_{NE}$ becomes (for $R_L=R_{O_{diff}}$):

$$\frac{R_E}{R_{NE}} = \qquad (11)$$

$$\frac{DREG}{DREG+PRE} \cdot \frac{2DREG+2PRE+3PT}{2DREG+3PRE+3PT} \cdot \frac{DREG+3PRE+3PT}{DREG+PRE+3PT}$$

The first two terms of Equation 11 are smaller than 1, whereas the third term is larger than 1. Thus, $R_E$ can be less than, equal to, or greater than $R_{NE}$ depending on the circumstances. Consider further the case where PT=0, meaning DREG+PRE is equal to a constant (denoted as K). In this case, $R_E/R_{NE}$ becomes (for $R_L=R_{O_{diff}}$, PT=0):

TABLE 7

| Parameter | Basic Architecture | Alternative Architecture |
|---|---|---|
| $R_E$ | $\dfrac{2R}{DREG_{BASIC}+DPRE_{BASIC}} + \dfrac{R}{PT} \| R_L$ | $\dfrac{2R}{DREG_{ALT}+PRE_{ALT}} + \dfrac{R}{PT} \| R_L$ |
| $R_{NE}$ | $\dfrac{R_{E(BASIC)}}{\left[1+\dfrac{2\left(\dfrac{R}{PT} \| R_L\right)}{\dfrac{R}{DREG_{BASIC}}+\dfrac{R}{DPRE_{BASIC}}}\right]}$ | $\dfrac{2R}{DREG_{ALT}} + \dfrac{R}{(PT+PRE_{ALT})} \| R_L$ |

$$\frac{R_E}{R_{NE}} = 1 + \frac{\frac{PRE}{K}\left(1 - 4\frac{PRE}{K}\right)}{2 + \frac{PRE}{K}} \quad (12)$$

Figure 11:
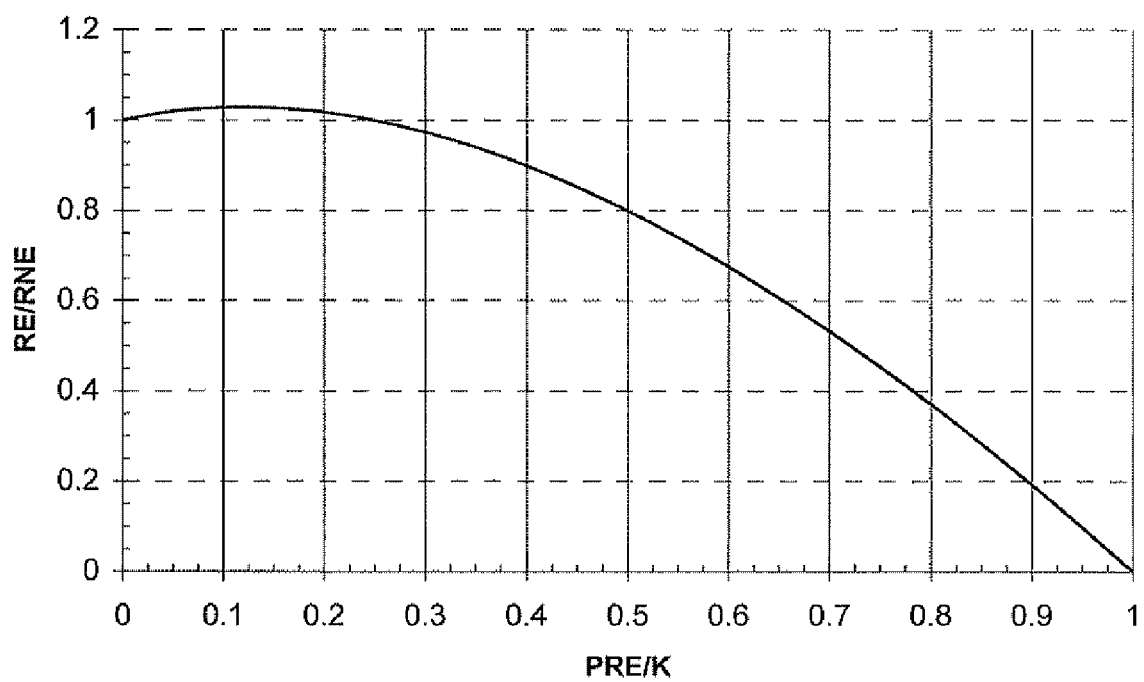
FIG. 11 shows a plot of $R_E/R_{NE}$ versus PRE/K for a configurable VM transmitter with alternative pre-emphasis architecture for $R_L = R_{Odiff}$, PT=0.

Equation 12 is illustrated graphically in FIG. 11. Consider the following characteristics of Equation 12 and FIG. 10.

The behavior of the ratio $R_E/R_{NE}$ is that of a negative quadratic-like function of PRE/K with a local maximum occurring midway between the two settings for PRE that result in $R_E/R_{NE}=1$ (PRE=0 and PRE=K/4).

The case PRE=0 corresponds to no pre-emphasis, and the case PRE=K/4 corresponds to a pre-emphasis ratio of 0.75.

The local maximum for $R_E/R_{NE}$ is at PRE=K/8 and is equal to 35/34 (~1.03). Thus, for small amounts of pre-emphasis, the supply current draw is nearly the same for emphasized and non-emphasized bits.

For PRE>K/4, (pre-emphasis ratio<0.75), $R_E/R_{NE}$ is less than 1 and monotonically decreasing with increasing PRE, meaning that less power is dissipated for non-emphasized bits than for emphasized bits. This is in stark contrast to the basic pre-emphasis architecture, where more power was dissipated for non-emphasized bits than for emphasized bits.

For a relatively small pre-emphasis ratio of 0.5, corresponding to PRE/K=0.5, (one has little practical need to go below this), $R_E/R_{NE}$ is 0.8, which compares very favorably to the corresponding $R_E/R_{NE}$ for the basic pre-emphasis architecture (1.75).

Thus, even for small pre-emphasis ratios, the discrepancy in supply current draw for emphasized and non-emphasized bits is much smaller for the alternative pre-emphasis architecture than for the basic architecture.

While the invention has been described with respect to a limited number of embodiments, it will be appreciated that many variations, modifications and other applications of the invention may be made. For example, one could implement the cells disclosed herein with other functional equivalents. As is would be obvious to one skilled in the art, all cells of the present invention, in full or in part, may be implemented as integrated circuits in a semiconductor (e.g. silicon) chip.

Throughout the description of the first embodiment above, the notion of a one-to-one correspondence between an individual enabled cell and the value of D, DREG, PRE, PT, PU, or PD is not an essential feature of the invention. That is to say that the enabling of a cell for a particular function does not necessarily imply an increment of 1 for D, DREG, PRE, PT, PU, or PD. For example, it may be advantageous to construct a set of drive cells that are binary-weighted in terms of strength. The architectures of the drive portions of these cells are identical, but the implementations are scaled accordingly. A base drive cell (that would increment of the value of D by 1 when enabled) may use PMOS and NMOS transistors of a nominal size and a nominal resistor magnitude of R. A double-strength drive cell (that would increment the value of D by 2 when enabled) may employ PMOS and NMOS transistors of twice the nominal size of the base drive cell, and employ a resistor magnitude of R/2. A quadruple-strength drive cell (that would increment the value of D by 4 when enabled) might employ PMOS and NMOS transistors of four times the nominal size of the base drive cell, and employ a resistor magnitude of R/4. Similarly, larger binary-scaled drive cells (e.g. 8×, 16×, etc . . . ) can be constructed. From the perspective of the invention, there is no functional difference between M parallel drive cells that each employ unit-sized transistor devices and enable resistive paths of magnitude R and a single drive cell that employs unit-sized transistors scaled by a factor M and enables resistive paths of magnitude R/M. For the purposes of this invention, the two implementations should be considered equal.

Another possible modification of the invention relates to the resistive path magnitude asymmetry. The discussion of the Background transmitter architectures as well as the architectures disclosed above typically assumed that the cells of a transmitter control resistive paths between the transmitter outputs and VDD or VSS (e.g. basically in all cases except for parallel termination cells), in which the resistive paths to VDD and the resistive paths to VSS have the same magnitude, giving rise to a natural common-mode output level of VDD/2. A deviation from this assumption can be interpreted in two ways:

The first interpretation is essentially that described with respect to the functional equivalence of the cell implementation above, and would correspond to the case where the resistive path magnitude to VDD and to VSS were consistent for any given cell, but may vary from one cell to another. The second interpretation applies to the case where, within a cell, the resistive path magnitude to VDD was different than the magnitude to VSS. This arrangement would yield identical output swing characteristics and a similar expression for differential output resistance as compared to the symmetric case.

Yet another modification of the invention relates to other pre-emphasis applications. The description above makes specific mention of post-cursor pre-emphasis. It should be noted that, using either the basic or alternative pre-emphasis architecture, it is straightforward to implement any form of pre-emphasis. The single-tap pre-emphasis architecture may easily be extended to a multi-tap pre-emphasis architecture. It is also possible to implement a non-binary signaling scheme such as 4-PAM (4-level Pulse Amplitude Modulation) with either the basic or alternative pre-emphasis architecture. In this sense, it would be understood by one skilled in the art that a transmitter architecture supporting N-PAM signaling is inherently similar to a transmitter which implements multi-tap pre-emphasis, and that the configurable VM architectures of the present invention could be adapted for use with such transmitters.

All publications and patents mentioned in this specification are incorporated herein in their entirety by reference into the specification, to the same extent as if each individual publication or patent was specifically and individually indicated to be incorporated herein by reference. In addition, citation or identification of any reference in this application shall not be construed as an admission that such reference is available as prior art to the present invention.

What is claimed is:

1. A voltage mode transmitter comprising:
   a. a first plurality of N drive cells, each drive cell having an enable/disable function, a drive cell input port and a drive cell output port; and
   b. a second plurality M of parallel termination cells, each parallel termination cell having an enable/disable function and a parallel termination cell output port,
   wherein each drive cell is connected with its input port to a differential serial data signal input and wherein each drive cell and each parallel termination cell is connected with its output port in parallel across a predetermined external load to provide a configurable output parameter, wherein the N drive cells include a first integer number D≧1 of enabled drive cells, wherein the M parallel termination cells include a second integer number PT≧1 of enabled parallel termination cells and wherein D+PT is a constant number chosen to provide a transmitter differential output impedance that matches the predetermined external load;

whereby the configurability is obtained by varying at least one of D and PT.

2. A voltage mode transmitter comprising:
a. a first plurality of N drive cells, each drive cell having an enable/disable function, a drive cell input port and a drive cell output port; and
b. a second plurality M of parallel termination cells, each parallel termination cell having an enable/disable function and a parallel termination cell output port, wherein the parallel termination cells are disabled, wherein each drive cell is connected with its input port to a differential serial data signal input and wherein each drive cell and each parallel termination cell is connected with its output port in parallel across a predetermined external load to provide a configurable output parameter and wherein the N drive cells include an integer number D≧1 of enabled drive cells chosen to provide a differential output impedance smaller than the predetermined external load;

whereby each drive cell and the parallel termination cell may be enabled and disabled by a corresponding assertion of their respective enable/disable function and whereby the output parameter is configurable by enabling at least one drive cell or parallel termination cell.

3. The voltage mode transmitter of claim 2, further comprising
c. a pre-emphasis structure coupled to the external load and used to provide a pre-emphasis functionality.

4. The voltage mode transmitter of claim 3, wherein the pre-emphasis structure is obtained by dividing the N drive cells into a bank of N-P regular drive cells and a bank of P pre-emphasis drive cells, wherein each pre-emphasis drive cell is connected with a respective input port to a differential pre-emphasis serial data input;
whereby the pre-emphasis functionality is provided by enabling at least one pre-emphasis drive cell.

5. The voltage mode transmitter of claim 4, wherein the N-P regular drive cells include a number DREG≧1 of enabled regular drive cells, wherein the P pre-emphasis drive cells include a number DPRE≧1 of enabled pre-emphasis drive cells, wherein the transmitter includes an integer number PT≧1 of enabled parallel termination cells and wherein DREG+DPRE+PT is a constant number chosen to provide a transmitter differential output impedance that matches the external load;
whereby the configurability is obtained by varying at least one of DREG, DPRE and PT.

6. The voltage mode transmitter of claim 4, wherein the external load is predetermined, wherein the parallel termination cell is disabled, wherein the N-P regular drive cells include a number DREG≧1 of enabled regular drive cells chosen to provide a differential output impedance smaller than the predetermined external load.

7. A voltage mode transmitter comprising:
a. a first plurality of N drive cells, each drive cell having an enable/disable function, a drive cell input port and a drive cell output port; and
b. a second plurality M of parallel termination cells, each parallel termination cell having an enable/disable function and a parallel termination cell output port,
wherein each drive cell is connected with its input port to a differential serial data signal input and wherein each drive cell and each parallel termination cell is connected with its output port in parallel across an external load to provide a configurable output parameter; and
c. at least one pre-emphasis drive cell having an enable/disable function, a pre-emphasis cell input port and a pre-emphasis cell output port, wherein each pre-emphasis drive cell is connected with its input port to both the differential serial data signal input and to a differential pre-emphasis serial data input and connected with its output port in parallel across the external load;
whereby each drive cell and the parallel termination cell may be enabled and disabled by a corresponding assertion of their respective enable/disable function, whereby the output parameter is configurable by enabling at least one drive cell or parallel termination cell and whereby the enabling and disabling of a pre-emphasis drive cell enable/disable function provides a pre-emphasis functionality to the transmitter.

8. The voltage mode transmitter of claim 7, wherein the N drive cells include an integer number DREG≧1 of enabled drive cells, wherein the at least one pre-emphasis drive cell includes an integer number DPRE≧1 of enabled pre-emphasis drive cells, wherein the transmitter includes an integer number PT≧1 of enabled parallel termination cells and wherein DREG+DPRE+PT is a constant number chosen to provide a transmitter differential output impedance that matches the external load;
whereby the configurability is obtained by varying at least one of DREG, DPRE and PT.

9. The voltage mode transmitter of claim 7, wherein the external load is predetermined, wherein the parallel termination cell is disabled, wherein the N drive cells include a number DREG≧1 of enabled drive cells chosen to provide a differential output impedance smaller than the predetermined external load.

10. A voltage mode transmitter comprising:
a. a first plurality of N drive cells, each drive cell having an enable/disable function, a drive cell input port and a drive cell output port; and
b. a second plurality M of parallel termination cells, each parallel termination cell having an enable/disable function and a parallel termination cell output port,
wherein each drive cell is connected with its input port to a differential serial data signal input and wherein each drive cell and each parallel termination cell is connected with its output port in parallel across an external load to provide a configurable output parameter;
c. at least one pull-up cell having an enable/disable function and a pull-up cell output port, the output port connected to the external load; and
d. at least one pull-down cell having an enable/disable function and a pull-down cell output port, the output port connected to the external load;
whereby each drive cell and the parallel termination cell may be enabled and disabled by a corresponding assertion of their respective enable/disable function, whereby the output parameter is configurable by enabling at least one drive cell or parallel termination cell and whereby the output parameter across the external load is also configurable by enabling at least one pull-up or pull-down cell.

11. The voltage mode transmitter of claim 10, wherein the N drive cells include a first integer number $D \geq 1$ of enabled drive cells, a second integer number $PT \geq 1$ of enabled parallel termination cells, a third integer number $PU \geq 0$ of enabled pull-up cells and a fourth integer number $PD \geq 0$ of enabled, pull-down cells and wherein $D+PT+PU+PD$ is a constant number chosen to provide a transmitter differential output impedance that matches the external load;

whereby the configurability is obtained by varying at least one of D, PT, PU and PD.

12. The voltage mode transmitter of claim 10, wherein the external load is predetermined, wherein the parallel termination cell is disabled and wherein the N drive cells include a first integer number $D \geq 1$ of enabled drive cells, a second integer number $PU \geq 0$ of enabled pull-up cells and a third integer number $PD \geq 0$ of enabled pull-down cells chosen to provide a differential output impedance smaller than the predetermined external load.

13. The voltage mode transmitter of claim 10, further comprising e. a pre-emphasis structure coupled to the external load and used to provide a pre-emphasis functionality.

14. The voltage mode transmitter of claim 13, wherein the pre-emphasis structure is obtained by dividing the N drive cells into a bank of N-P regular drive cells and a bank of P pre-emphasis drive cells, wherein each pre-emphasis drive cell is connected with its input port to a differential pre-emphasis serial data input and wherein the enabling of at least one pre-emphasis drive cell provides the pre-emphasis functionality.

15. The voltage mode transmitter of claim 14, wherein the N-P regular drive cells include a number $DREG \geq 1$ of enabled regular drive cells, wherein the P pre-emphasis drive cells include a number $DPRE \geq 1$ of enabled pre-emphasis drive cells, wherein the transmitter includes an integer number $PT \geq 1$ of enabled parallel termination cells and wherein $DREG+DPRE+PT$ is a constant number chosen to provide a transmitter differential output impedance that matches the external load;

whereby the configurability is obtained by varying at least one of DREG, DPRE and PT.

16. The voltage mode transmitter of claim 14, wherein the external load is predetermined, wherein the parallel termination cell is disabled, wherein the N-P regular drive cells include a number $DREG \geq 1$ of enabled regular drive cells chosen to provide a differential output impedance smaller than the predetermined external load.

17. The voltage mode transmitter of claim 10, further comprising at least one pre-emphasis cell having an enable/disable function, a pre-emphasis cell input port and a pre-emphasis cell output port, wherein each pre-emphasis cell is connected with its respective input port to both the differential serial data signal input and to a differential pre-emphasis serial data input and connected with its output port in parallel across the external load;

whereby the enabling and disabling of the pre-emphasis cell enable/disable function provides a pre-emphasis functionality to the transmitter.

18. The voltage mode transmitter of claim 17, wherein the N drive cells include an integer number $DREG \geq 1$ of enabled drive cells, wherein the at least one pre-emphasis drive cell includes an integer number $DPRE \geq 1$ of enabled pre-emphasis drive cells, wherein the transmitter includes an integer number $PT \geq 1$ of enabled parallel termination cells and wherein $DREG+DPRE+PT$ is a constant number chosen to provide a transmitter differential output impedance that matches the external load;

whereby the configurability is obtained by varying at least one of DREG, DPRE and PT.

19. The voltage mode transmitter of claim 17, wherein the external load is predetermined, wherein the parallel termination cell is disabled, wherein the N drive cells include a number $DREG \geq 1$ of enabled drive cells chosen to provide a differential output impedance smaller than the predetermined external load.

20. A voltage mode transmitter comprising:

a. a first plurality N of drive cells, each drive cell having an enable/disable function for enabling or disabling the cell, a drive cell input port and a drive cell output port; and b. a second plurality M of parallel termination cells, each parallel termination cell having a parallel termination cell output port and an enable/disable function for enabling or disabling the cell, wherein each drive cell is connected with its input port to a differential serial data signal input and wherein the drive cells and the parallel termination cells are connected in parallel across an external load to provide a configurable output parameter, wherein at least one drive cell is always enabled and wherein at least one drive cell other than the enabled drive cell and at least one parallel termination cell are combined into a combination cell that can be configured for operation as a cell selected from the group consisting of a drive cell, a parallel termination cell and a disabled cell; and c. a pre-emphasis structure coupled to the external load and operative to provide a pre-emphasis functionality, wherein the pre-emphasis structure is obtained by dividing the N drive cells into a bank of N-P regular drive cells and a bank of P pre-emphasis drive cells, wherein each pre-emphasis drive cell is connected with its input port to a differential pre-emphasis serial data input and wherein the enabling of at least one pre-emphasis drive cell provides the pre-emphasis functionality.

21. The voltage mode transmitter of claim 20, wherein the N-P regular drive cells include a number $DREG \geq 1$ of enabled regular drive cells, wherein the P pre-emphasis drive cells include a number $DPRE \geq 1$ of enabled pre-emphasis drive cells, wherein the transmitter includes an integer number $PT \geq 1$ of enabled parallel termination cells and wherein $DREG+DPRE+PT$ is a constant number chosen to provide a transmitter differential output impedance that matches the external load;

whereby the configurability is obtained by varying at least one of DREG, DPRE and PT.

22. The voltage mode transmitter of claim 20, wherein the external load is predetermined, wherein the parallel termination cell is disabled, wherein the N-P regular drive cells include a number $DREG \geq 1$ of enabled regular drive cells chosen to provide a differential output impedance smaller than the predetermined external load.

23. A voltage mode transmitter comprising:

a. a first plurality N of drive cells, each drive cell having an enable/disable function for enabling or disabling the cell, a drive cell input port and a drive cell output port; and b. a second plurality M of parallel termination cells, each parallel termination cell having a parallel termination cell output port and an enable/disable function for enabling or disabling the cell, wherein each drive cell is connected with its input port to a differential serial data signal input and wherein the drive cells and the parallel termination cells are connected in parallel across an external load to provide a configurable output parameter, wherein at least one drive cell is always enabled and wherein at least one drive cell other than the enabled drive cell and at least one parallel termination cell are combined into a combination cell that can be configured for operation as a cell selected from the group consisting of a drive cell, a parallel termination cell and a disabled cell; and c. at least one pre-emphasis cell having an enable/disable function, a pre-emphasis cell input port and a pre-emphasis cell output port, wherein each pre-emphasis cell is connected with its respective input port to both the differential serial data signal input and to a differential pre-emphasis serial data input and connected with its output port in parallel across the external load;

whereby the output parameter is configurable by enabling at least one cell selected from the group consisting of a drive cell, a parallel termination cell and a combination cell and whereby the enabling and disabling of the pre-emphasis cell enable/disable function provides a pre-emphasis functionality to the transmitter.

24. The voltage mode transmitter of claim 23, wherein the N drive cells include an integer number DREG$\geq$1 of enabled drive cells, wherein the at least one pre-emphasis drive cell includes an integer number DPRE$\geq$1 of enabled pre-emphasis drive cells, wherein the transmitter includes an integer number PT$\geq$1 of enabled parallel termination cells and wherein DREG+DPRE+PT is a constant number chosen to provide a transmitter differential output impedance that matches the external load;

whereby the configurability is obtained by varying at least one of DREG, DPRE and PT.

25. The voltage mode transmitter of claim 23, wherein the external load is predetermined, wherein the parallel termination cell is disabled, wherein the N drive cells include a number DREG$\geq$1 of enabled drive cells chosen to provide a differential output impedance smaller than the predetermined external load.

26. A voltage mode transmitter comprising:

a. a first plurality N of drive cells, each drive cell having an enable/disable function for enabling or disabling the cell, a drive cell input port and a drive cell output port;

b. a second plurality M of parallel termination cells, each parallel termination cell having a parallel termination cell output port and an enable/disable function for enabling or disabling the cell, wherein each drive cell is connected with its input port to a differential serial data signal input and wherein the drive cells and the parallel termination cells are connected in parallel across an external load to provide a configurable output parameter, wherein at least one drive cell is always enabled and wherein at least one drive cell other than the enabled drive cell and at least one parallel termination cell are combined into a combination cell that can be configured for operation as a cell selected from the group consisting of a drive cell, a parallel termination cell and a disabled cell;

c. at least one pull-up cell having an enable/disable function and a pull-up cell output port; and d. at least one pull-down cell having an enable/disable function and a pull-down cell output port, wherein all pull-up and pull-down cells are connected with their respective output ports in parallel with all drive and parallel termination cells across the external load and wherein each pull-up and pull-down cell may be enabled by an independent enable signal applied to its respective enable/disable function;

whereby the output parameter is configurable by enabling at least one cell selected from the group consisting of a drive cell, a parallel termination cell and a combination cell and whereby the output voltage swing across the external load is also configurable by enabling at least one pull-up or pull-down cell.

27. The voltage mode transmitter of claim 26, wherein the N drive cells include a first integer number D$\geq$1 of enabled drive cells, a second integer number PT$\geq$1 of enabled parallel termination cells, a third integer number PU$\geq$1 of enabled pull-up cells and a fourth integer number PD$\geq$0 of enabled pull-down cells and wherein D+PT+PU+PD is a constant number chosen to provide a transmitter differential output impedance that matches the external load;

whereby the configurability is obtained by varying at least one of D, PT, PU and PD.

28. The voltage mode transmitter of claim 26, wherein the external load is predetermined, wherein the parallel termination cell is disabled and wherein the N drive cells include a first integer number D$\geq$1 of enabled drive cells, a second integer number PU+0 of enabled pull-up cells and a third integer number PD$\geq$0 of enabled pull-down cells chosen to provide a differential output impedance smaller than the predetermined external load.

29. The voltage mode transmitter of claim 26, further comprising e. a pre-emphasis structure coupled to the external load and used to provide a pre-emphasis functionality.

30. The voltage mode transmitter of claim 29, wherein the pre-emphasis structure is obtained by dividing the N drive cells into a bank of N-P regular drive cells and a bank of P pre-emphasis drive cells, wherein each pre-emphasis drive cell is connected with a respective input port to a differential pre-emphasis serial data input and wherein the enabling of at least one pre-emphasis drive cell provides the pre-emphasis functionality.

31. The voltage mode transmitter of claim 30, wherein the N-P regular drive cells include a number DREG$\geq$1 of enabled regular drive cells, wherein the P pre-emphasis drive cells include a number DPRE$\geq$1 of enabled pre-emphasis drive cells, wherein the transmitter includes an integer number PT$\geq$1 of enabled parallel termination cells and wherein DREG+DPRE+PT is a constant number chosen to provide a transmitter differential output impedance that matches the external load;

whereby the configurability is obtained by varying at least one of DREG, DPRE and PT.

32. The voltage mode transmitter of claim 30, wherein the external load is predetermined, wherein the parallel termination cell is disabled, wherein the N-P regular drive cells include a number DREG$\geq$1 of enabled regular drive cells chosen to provide a differential output impedance smaller than the predetermined external load.

33. The voltage mode transmitter of claim 26, further comprising at least one pre-emphasis cell having an enable/disable function, a pre-emphasis cell input port and a pre-emphasis cell output port, wherein each pre-emphasis cell is connected with its respective input port to both the differential serial data signal input and to a differential pre-emphasis serial data input and connected with its output port in parallel across the external load;

whereby the enabling and disabling of the pre-emphasis cell enable/disable function provides a pre-emphasis functionality to the transmitter.

34. The voltage mode transmitter of claim 33, wherein the N drive cells include an integer number DREG$\geq$1 of enabled drive cells, wherein the at least one pm-emphasis drive cell includes an integer number $DPRE \geqq 1$ of enabled pre-emphasis drive cells, wherein the transmitter includes an integer number $PT \geqq 1$ of enabled parallel termination cells and wherein $DREG+DPRE+PT$ is a constant number chosen to provide a transmitter differential output impedance that matches the external load;

whereby the configurability is obtained by varying at least one of DREG, DPRE and PT.

35. The voltage mode transmitter of claim 33, wherein the external load is predetermined, wherein the parallel termination cell is disabled, wherein the N drive cells include a number $DREG \geqq 1$ of enabled drive cells chosen to provide a differential output impedance smaller than the predetermined external load.

* * * * *